US007285841B2

(12) United States Patent
Yoshida et al.

(10) Patent No.: US 7,285,841 B2
(45) Date of Patent: Oct. 23, 2007

(54) METHOD OF MANUFACTURING SIGNAL PROCESSING APPARATUS

(75) Inventors: Yukihisa Yoshida, Tokyo (JP); Tamotsu Nishino, Tokyo (JP); Yoshiyuki Suehiro, Tokyo (JP); Sangseok Lee, Tokyo (JP); Kenichi Miyaguchi, Tokyo (JP); Jiwei Jiao, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 101 days.

(21) Appl. No.: 11/360,385

(22) Filed: Feb. 24, 2006

(65) Prior Publication Data

US 2006/0145789 A1 Jul. 6, 2006

Related U.S. Application Data

(62) Division of application No. 10/421,780, filed on Apr. 24, 2003, now Pat. No. 7,030,721.

(30) Foreign Application Priority Data

Apr. 25, 2002 (JP) ............................ 2002-124431
Feb. 18, 2003 (JP) ............................ 2003-039934

(51) Int. Cl.
*H01P 3/08* (2006.01)
*H01L 21/70* (2006.01)

(52) U.S. Cl. ...................... 257/531; 257/396; 438/406; 333/246

(58) Field of Classification Search ................ 257/531, 257/374, 396; 438/381, 406, 384; 333/246
See application file for complete search history.

(56) References Cited

U.S. PATENT DOCUMENTS 5,781,091 A 7/1998 Krone et al.
5,874,770 A * 2/1999 Saia et al. .................. 257/536
5,874,883 A 2/1999 Uemura et al.
5,903,239 A 5/1999 Takahashi et al.

(Continued)

FOREIGN PATENT DOCUMENTS

JP 10-125860 5/1998

(Continued)

OTHER PUBLICATIONS

Robertson et al. "A 10-60-GHz Micromachined Directional Coupler", IEEE Transactions on Microwave Theory and Techniques, vol. 46, No. 11, Nov. 1998, pp. 1845-1849.

(Continued)

*Primary Examiner*—Dinh T. Le
(74) *Attorney, Agent, or Firm*—Leydig, Voit & Mayer, Ltd.

(57) ABSTRACT

In a signal processing apparatus for transmitting or processing a signal, a substrate has a recessed portion in a surface of the substrate, a first interconnecting conductor is on the substrate, including at least the recessed portion of the substrate, and a dielectric support film is on the substrate opposite the recessed portion of the substrate with an air space between the dielectric support film and the substrate. A second interconnecting conductor is on a part of a surface of the dielectric support film. The apparatus has a simple structure and reduced transmission loss and can be made in a simple manufacturing process.

4 Claims, 30 Drawing Sheets

U.S. PATENT DOCUMENTS 5,990,768 A 11/1999 Takahashi et al.
6,083,802 A 7/2000 Wen et al.
6,323,096 B1 * 11/2001 Saia et al. .................. 438/384
6,400,027 B1 6/2002 Takahashi
6,410,960 B1 * 6/2002 Arai et al. .................. 257/347
6,649,998 B2 11/2003 Song
6,768,400 B2 7/2004 Tanabe
6,778,041 B2 8/2004 Takahashi et al.

FOREIGN PATENT DOCUMENTS

JP 10-163711 6/1998

OTHER PUBLICATIONS

Milanović et al. "Micromachined Microwave Transmission Lines in CMOS Technology", IEEE Transactions on Microwave Theory and Techniques, vol. 45, No. 5, May 1997, pp. 630-635.

* cited by examiner

FIRST PREFERRED EMBODIMENT

MODIFIED PREFERRED EMBODIMENT
OF FIRST PREFERRED EMBODIMENT

SECOND PREFERRED EMBODIMENT

MODIFIED PREFERRED EMBODIMENT
OF SECOND PREFERRED EMBODIMENT

THIRD PREFERRED EMBODIMENT

FIFTH PREFERRED EMBODIMENT

SIXTH PREFERRED EMBODIMENT

SEVENTH PREFERRED EMBODIMENT

METHOD OF MANUFACTURING SIGNAL PROCESSING APPARATUS

BACKGROUND OF THE INVENTION

1. Field of the Invention

The present invention relates to a high frequency apparatus and a method for manufacturing the same high frequency apparatus. In particular, the present invention relates to a high frequency apparatus for transmitting or processing a high frequency signal of microwave, sub-millimeter wave, millimeter wave or the like, such as a high frequency transmission line, a high frequency device, a high frequency circuit or the like, and to a method for manufacturing the same high frequency apparatus.

2. Description of the Related Art

In recent years, with increasing desire for improvement in high frequency transmission techniques, as a prior art relating to high frequency transmission lines for microwaves, sub-millimeter waves and millimeter waves, there has been proposed a microstrip millimeter waveguide (hereinafter, referred to as a first prior art), disclosed in FIG. 1 of the Japanese Patent Laid-Open Publication No, JP-10-163711-A.

The microstrip type millimeter waveguide according to this first prior art is characterized by having the following structure:

(a) a first single crystal substrate has a recess formed therein by an anisotropic etching;

(b) a conductor is stacked as a grounding surface on a surface on which the recess is formed;

(c) a second single crystal substrate has a first microstrip line conductor and a conductor serving as a grounding surface, where the first microstrip conductor is formed on one surface of the second single crystal substrate, and the conductor is formed on another surface thereof which connects with the first single crystal substrate; and (d) the first and second single crystal substrates are connected with each other in such a way that a first microstrip line provided on the second single crystal substrate is placed on the recess formed in the first single crystal substrate.

That is, this microstrip type millimeter waveguide has such a constitution that a strip conductor of the microstrip line formed on the second single crystal substrate and the grounding conductor film formed on the recess of the first single crystal substrate are formed via an air space between the second single crystal substrate and the grounding conductor film.

Also, in a high frequency passive circuit for processing a high frequency signal of microwave, sub-millimeter wave, millimeter wave or the like according to a prior art, in order to reduce the insertion loss, either a semiconductor substrate such as a gallium arsenide substrate or a dielectric substrate having a low dielectric constant such as a sapphire substrate is used, and moreover, the thickness of the substrate is made to be thin. However, the dielectric substrate having the low dielectric constant is generally high priced, and thinning of the dielectric substrate can be done up to at most about 100 μm, and there is such a limitation on the improvement in the electrical performance in the high frequency bands. On the other hand, a semiconductor substrate such as a low-priced semiconductor substrate has a large dielectric loss such that there can not be obtained any enough electrical characteristic.

In recent years, attention has been paid to so-called RF MEMS (Radio Frequency Micro-Electro-Mechanical-Systems) devices, which are high frequency devices using the micromachining technique. Since this technique is capable of fabricating a high aspect structure and a membrane structure, even if a high frequency circuit is fabricated on a low-priced silicon substrate, the high frequency circuit is less subject to influences of the same substrate, and this leads to that we can expect that there can be obtained a low-cost, high-performance high frequency device. Also in recent years, in silicon CMOS circuits for use in high frequencies, their usable upper-limit frequency has expanded to the GHz band, thus making it expected that higher-function, smaller-size high frequency modules are implemented by forming silicon CMOS active circuits and RF-MEMS passive circuits into monolithic circuits, respectively.

As a typical structure for reducing the dielectric loss of the substrate by using the RF MEMS technique, up to now, there has been disclosed such a structure that an interconnecting conductor is formed on a dielectric membrane support film, for example, in FIG. 1 of a prior art document of Stephen V. Robertson et al., "A 10-60-GHz Micromachined Directional Coupler," IEEE Transactions on Microwave Theory & Techniques, Vol. 46, No. 11, p. 1845-1849, November 1998. In the shielded membrane microstrip line as disclosed in the above-mentioned prior art document (hereinafter, referred to as a second prior art), on a first semiconductor substrate having a grounding conductor film on its top surface, there is stacked a second semiconductor substrate, where a dielectric membrane support film having a strip conductor is formed on the top surface of the second semiconductor substrate, and an air space is formed on the bottom surface. Moreover, a further semiconductor substrate having a recessed portion in its bottom surface is stacked on the second semiconductor substrate. Then a microstrip line is made up.

In the membrane microstrip line according to the second prior art as constituted as shown above, when a high frequency signal is transmitted on the membrane microstrip line, an electromagnetic field of the high frequency signal is distributed in the dielectric membrane support film and an air layer of the air space which are located between the strip conductor and the grounding conductor film. In this case, since almost no electromagnetic field is generated in these semiconductor substrates, there can be obtained such an advantageous effect that the transmission loss can be reduced.

However, in the microstrip type millimeter waveguide according to the first prior art and the membrane microstrip line according to the second prior art, because of use of two or more semiconductor substrates, each of them has a complex structure and needs a complex manufacturing process, and this leads to such a problem that the manufacturing cost is increased. Furthermore, in these prior arts, there has been another problem that the transmission loss is still relatively high.

SUMMARY OF THE INVENTION

An essential object of the present invention is to provide a high frequency apparatus capable of solving the above-mentioned problems, and having a simple structure and a reduced transmission loss and capable of being made by a simple manufacturing process, as compared with those of these prior arts.

Another object of the present invention is to provide a method for manufacturing a high frequency apparatus capable of solving the above-identified problems, and having a simple structure and a reduced transmission loss and capable of being made by a simple manufacturing process, as compared with those of these prior arts.

In order to achieve the above-mentioned objective, according to one aspect of the present invention, there is provided a high frequency apparatus with a substrate having a recessed portion formed in a surface of the substrate. A first interconnecting conductor is formed on the substrate including at least the recessed portion of the substrate, and a dielectric support film is formed on the substrate above the recessed portion of the substrate with an air space sandwiched between the dielectric support film and the substrate. A second interconnecting conductor is formed on a part of a surface of the dielectric support film.

According to another aspect of the present invention, there is provided a method for manufacturing a high frequency apparatus including the following processing steps. In the method, a surface of a substrate is etched to a predetermined depth, and a recessed portion is formed in the surface of the substrate. Then one of a first interconnecting conductor and a third interconnecting conductor is formed on the substrate including at least the recessed portion of the substrate. A material of a sacrificial layer is filled into the recessed portion of the substrate, and there is removed the material of the sacrificial layer formed on the substrate excluding at least the recessed portion of the substrate and an area in the vicinity of the recessed portion of the substrate. Thereafter, a sacrificial layer is formed by performing planarization in such a manner that the surface of the sacrificial layer and one of the surface of the substrate and the first interconnecting conductor become substantially an identical horizontal surface to each other. A dielectric support film is formed on at least the planarized surface of the sacrificial layer and the substrate, and a second interconnecting conductor is formed on a surface of the dielectric support film. Further, at least one opening portion above the sacrificial layer is formed so as to pass through the dielectric support film, and the sacrificial layer is removed via the opening portion.

According to a further aspect of the present invention, there is provided a high frequency apparatus provided with a first substrate having a recessed portion formed in a surface of the first substrate. A first grounding conductor is formed on the first substrate including at least the recessed portion of the first substrate, and a dielectric support film is formed on the first substrate above the recessed portion of the first substrate with an air space sandwiched between the first substrate and the dielectric support film. Then an interconnecting conductor for transmission use is formed on a part of a surface of the dielectric support film, and second grounding conductors are formed on the surface of the dielectric support film located on both sides of the interconnecting conductor film for transmission use with a spacing between the interconnecting conductor and each of the second grounding conductors.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
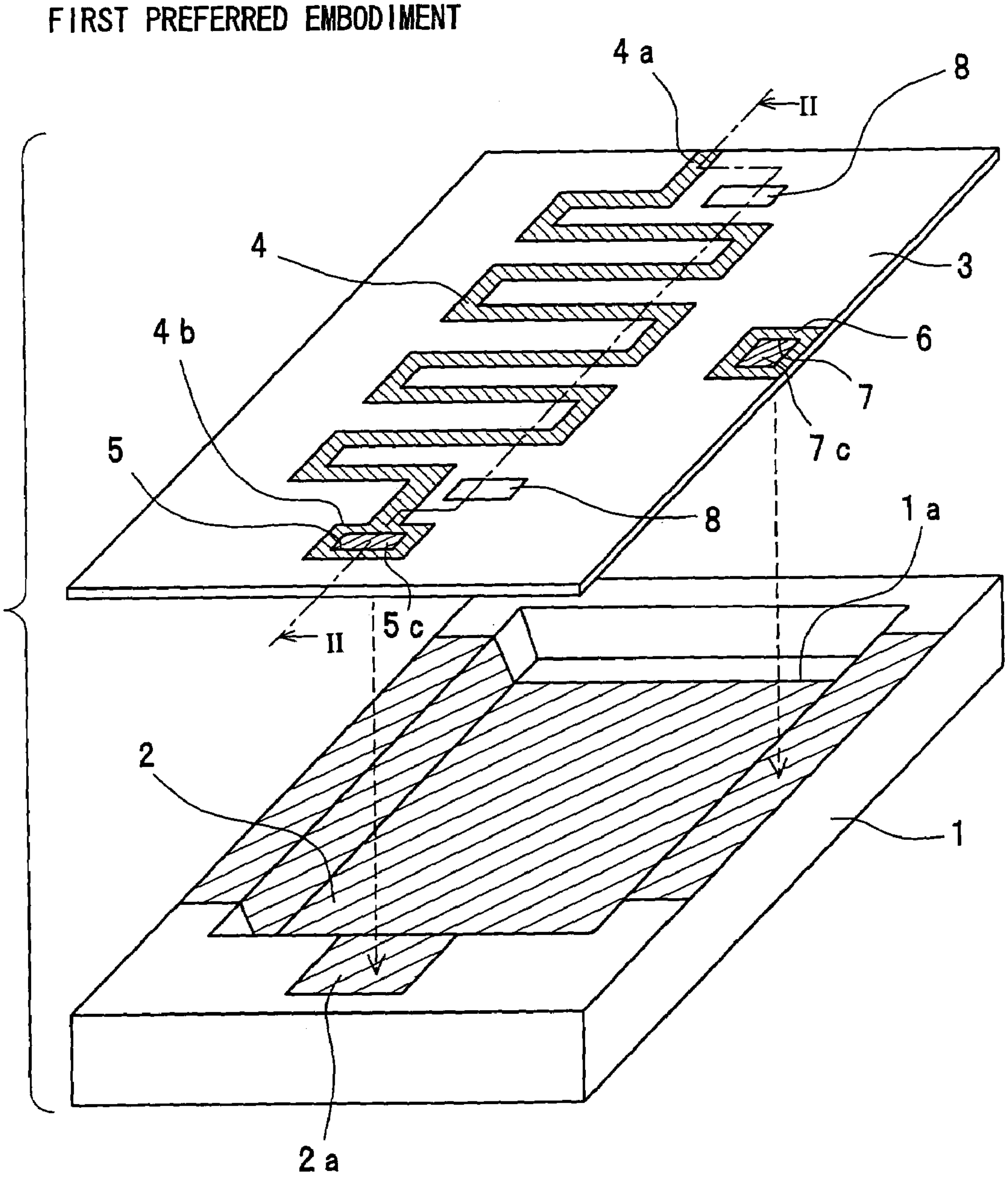
FIG. 1 is an exploded perspective view showing a structure of a grounding type inductor device of a first preferred embodiment according to the present invention.

Hereinbelow, various kinds of referred embodiments according to the present invention will be described in detail with reference to drawings attached herewith. It is noted that similar components are denoted by the same numerical references in the drawings, and their detailed description is omitted.

First Preferred Embodiment

Figure 2:
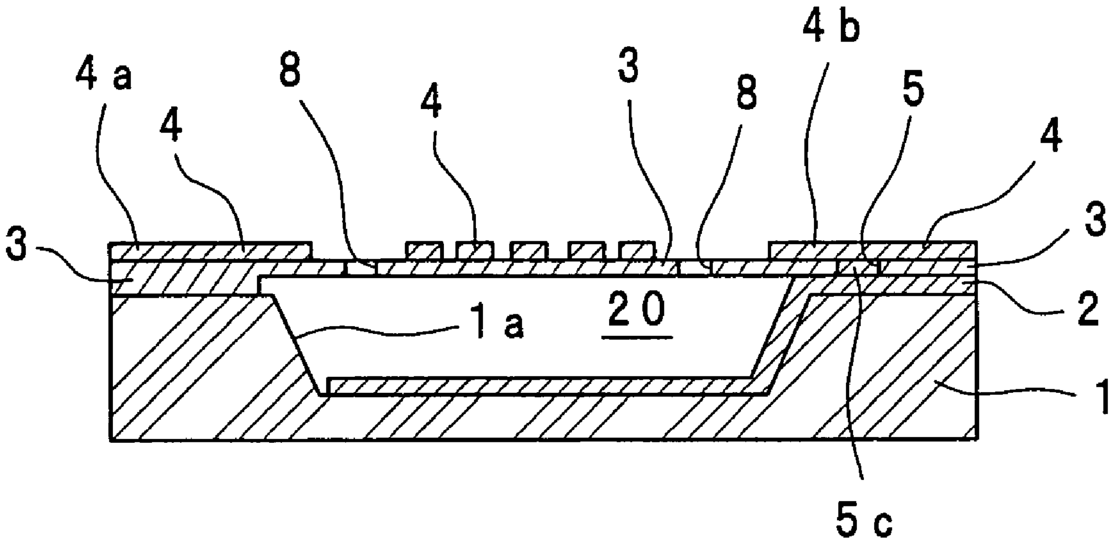
FIG. 2 is a longitudinal sectional view showing a cross section taken along the line II-II of FIG. 1.

FIG. 1 is an exploded perspective view showing a structure of a grounding inductor device of a first preferred embodiment according to the present invention, and FIG. 2 is a longitudinal sectional view showing a cross section taken along the line II-II of FIG. 1. The grounding inductor device according to this first preferred embodiment has, as shown in FIGS. 1 and 2, a microstrip line made up of a dielectric support film 3 which is formed on a surface of a silicon substrate 1 and on a recessed portion 1*a* in the silicon substrate 1, an interconnecting conductor film 4, which is a meander-shaped strip conductor on the dielectric support film 3, and sandwiching an air space in the recessed portion 1*a*, and a grounding conductor film 2 on the recessed portion 1*a*, thus constituting an inductor device. The interconnecting conductor film 4 is grounded by its end 4*b* connected with a grounding conductor film 2*a* via a through hole conductor 5*c* in a through hole 5.

Referring to FIGS. 1 and 2, in the silicon substrate 1, a recessed portion 1*a* having a shape of an inverted truncated-pyramid and having a predetermined depth is formed, and the grounding conductor film 2 made of Au is formed on the surface of the recessed portion 1*a* so as to extend from the surface of the recessed portion 1*a* to the surface of the silicon substrate 1, for example as shown by reference numeral 2*a*, in order to increase a Q value of the inductor device. A dielectric support film 3 made of SixNy (0<x<3, 2<y<5) is formed just above the silicon substrate 1 and its recessed portion 1*a* via an air space 20, and further, the interconnecting conductor film 4, which is of a meander-shaped strip conductor made of Au so as to form an inductor in high frequencies, is formed on the dielectric support film 3. One end 4*a* of the interconnecting conductor film 4 is formed as a terminal for connecting with the other high frequency circuit, while at a position of its opposing other end 4*b*, the through hole conductor 5*c* is filled in the through hole 5 formed so as to pass through the dielectric support film 3 in its thickness direction. Thus, the other end 4*b* is connected with the grounding conductor film 2*a* placed just under the through-hole conductor 5*c* via the through hole conductor 5*c*, so as to be grounded. That is, one end of the inductor device is grounded.

Also, an interconnecting conductor film 6 having a shape of a predetermined rectangular for use as taking-out electrode is formed in the dielectric support film 3 as located in the right-hand central portion of FIG. 1, and at the position of the interconnecting conductor film 6, a through hole 7 is formed so as to pass through the dielectric support film 3 in its thickness direction. A through hole conductor 7*c* is filled in the through hole 7, then the interconnecting conductor film 6 is connected with the grounding conductor film 2 via the through hole conductor 7*c* so as to be grounded. Thus, the interconnecting conductor film 6 becomes a taking-out electrode having a grounded voltage. Furthermore, rectangular-shaped opening portions 8 are formed so as to pass through the dielectric support film 3 at a plurality of portions above the recessed portion 1*a* of the silicon substrate 1 and in the dielectric support film 3 where the interconnecting conductor film 4 is not formed. The opening portions 8 are used for etching of the resist material of the resist sacrificial layer 32 filled in the recessed portion 1*a* in a manufacturing process which will be described in detail later. In this case, by removal of the resist sacrificial layer 32, an air space 20 having a volume almost generally equal to that of the recessed portion 1*a* and serving as an air layer is formed between the grounding conductor film 2 on the recessed portion 1*a* and the dielectric support film 3 having the interconnecting conductor film 4 formed therein.

Although the silicon substrate 1 is used in the first preferred embodiment described above, the present invention is not limited to this, and the other semiconductor substrate or a dielectric substrate such as a glass substrate or the like may be used. Also, the material of the dielectric support film 3 is not limited to SixNy, and it can be also made of silicon oxide film, and it may be a polyimide film or the like. Further, the material of the interconnecting conductor film 4 or the grounding conductor film 2 is not limited to Au, and it may be a metallic conductor film having a low resistance value, such as Cu or the like. These modifications are applicable to the other preferred embodiments as well.

FIGS. 3A to 3F and 4A to 4E are longitudinal sectional views showing respective steps of a manufacturing process for manufacturing the grounding type inductor device of FIG. 1. By referring to these FIGS. 3A to 3F and 4A to 4E, the manufacturing steps for manufacturing the grounding type inductor device of FIGS. 1 and 2 will be described below.

Figure 3A:
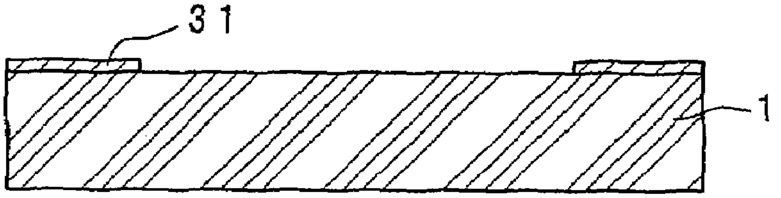
FIG. 3A is a longitudinal sectional view showing a first step of a manufacturing process of the grounding type inductor device of FIG. 1.

First of all, as shown in FIG. 3A, a mask pattern layer 31 made of silicon oxide film and having a predetermined pattern is formed on the surface of the silicon substrate 1 by using a thermal oxidation process and a photolithography.

Figure 3B:
FIG. 3B is a longitudinal sectional view showing a second step of the manufacturing process of the grounding type inductor device of FIG. 1.
Figure 3C:
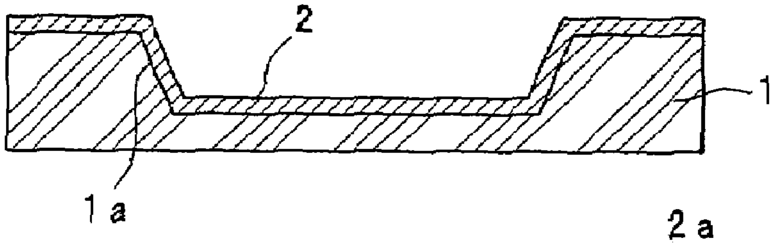
FIG. 3C is a longitudinal sectional view showing a third step of the manufacturing process of the grounding type inductor device of FIG. 1.
Figure 3D:
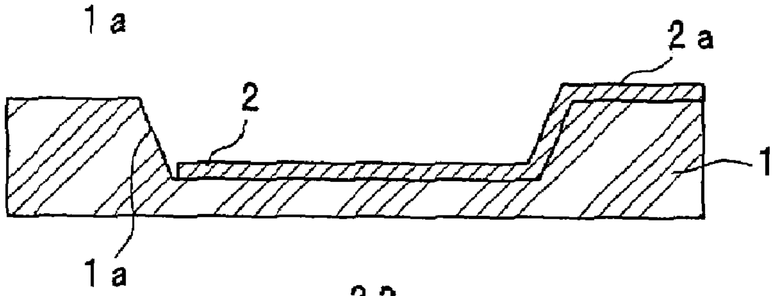
FIG. 3D is a longitudinal sectional view showing a fourth step of the manufacturing process of the grounding type inductor device of FIG. 1.
Figure 3E:
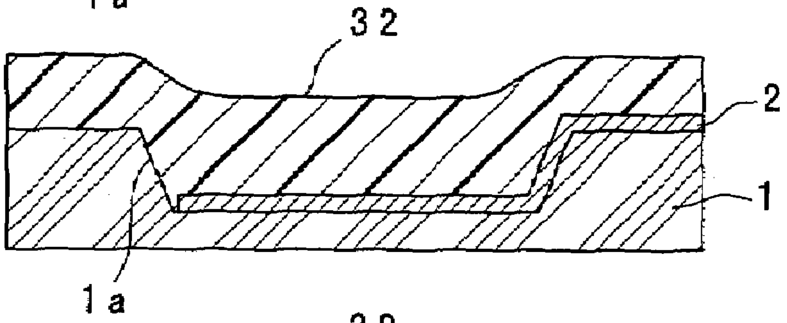
FIG. 3E is a longitudinal sectional view showing a fifth step of the manufacturing process of the grounding type inductor device of FIG. 1.
Figure 3F:
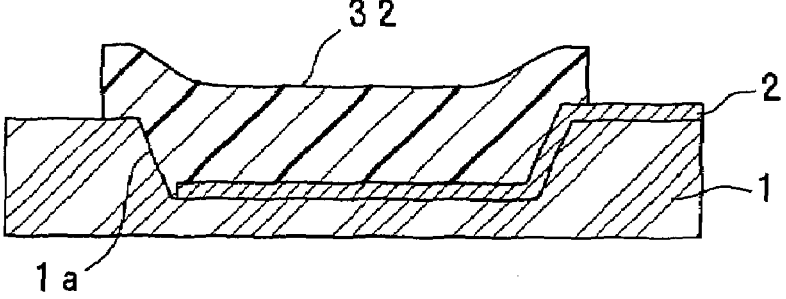
FIG. 3F is a longitudinal sectional view showing a sixth step of the manufacturing process of the grounding type inductor device of FIG. 1.

Next, as shown in FIG. 3B, the surface of the silicon substrate 1 is etched by the so-called micromachining technique with an alkaline aqueous solution made of, for example, KOH, so as to form the recessed portion 1*a* having a predetermined depth. The depth, to which the silicon substrate is to be etched, is determined based on a Q value required for the inductor device, and it may be preferably 30 μm as an example. Then, as shown in FIG. 3C, the grounding conductor film 2 made of Au is formed on the recessed portion 1*a* of the silicon substrate 1 so as to further extend onto the surface of the silicon substrate 1, by a sputtering process or the like. Further, as shown in FIG. 3D, unnecessary portions of the grounding conductor film 2 are removed by the photolithography and an ion beam etching process. Also, as shown in FIG. 3E, the resist sacrificial layer 32 is formed by coating a resist material on the surface of the silicon substrate 1, on its recessed portion 1*a* and on the grounding conductor film 2, so that the interior of the recessed portion 1*a* is filled with the resist material of the resist sacrificial layer 32. Further, as shown in FIG. 3F, the resist sacrificial layer 32 is partially etched by using the photolithography, so that its pattern portion larger than the recessed portion 1*a* remains, with the other pattern portions removed.

Figure 4A:
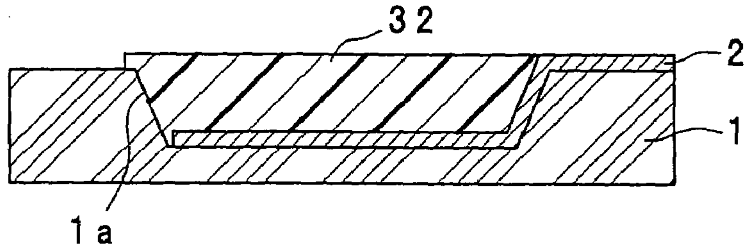
FIG. 4A is a longitudinal sectional view showing a seventh step of the manufacturing process of the grounding type inductor device of FIG. 1.
Figure 4B:
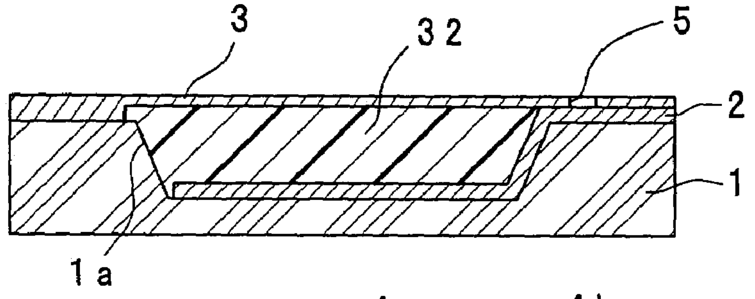
FIG. 4B is a longitudinal sectional view showing an eighth step of the manufacturing process of the grounding type inductor device of FIG. 1.
Figure 4C:
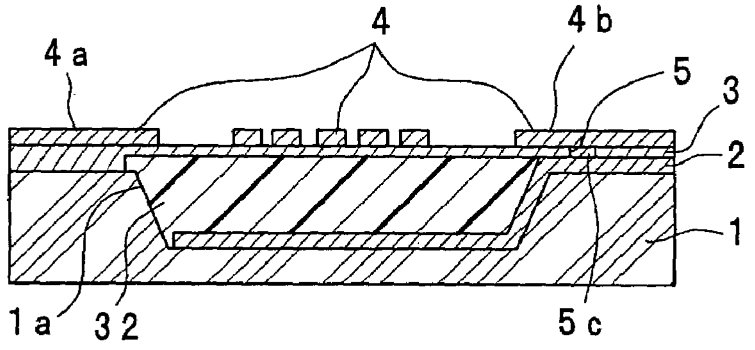
FIG. 4C is a longitudinal sectional view showing a ninth step of the manufacturing process of the grounding type inductor device of FIG. 1.
Figure 4D:
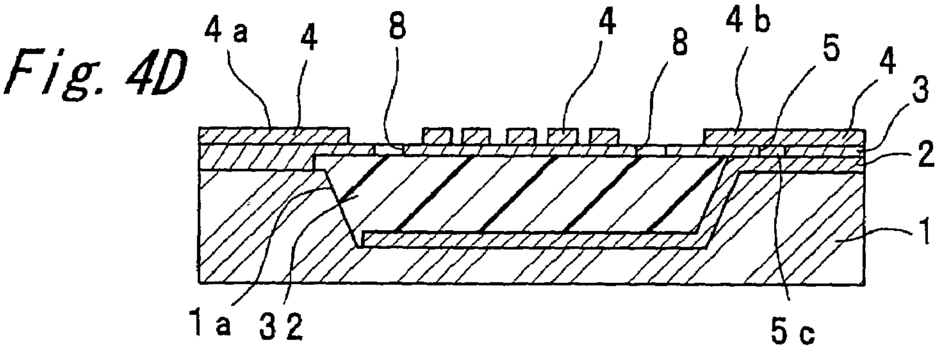
FIG. 4D is a longitudinal sectional view showing a tenth step of the manufacturing process of the grounding type inductor device of FIG. 1.
Figure 4E:
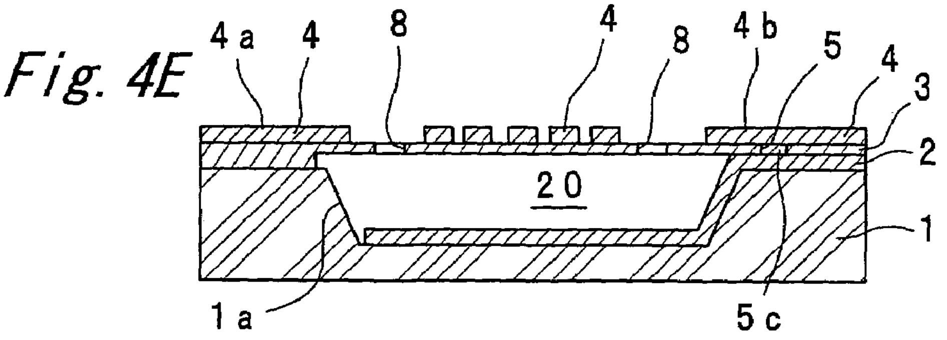
FIG. 4E is a longitudinal sectional view showing an eleventh step of the manufacturing process of the grounding type inductor device of FIG. 1.

Subsequently, as shown in FIG. 4A, on the silicon substrate 1 having the grounding conductor film 2 and the resist sacrificial layer 32 formed thereon, the top surface of the resist sacrificial layer 32 is polished so as to become substantially the same horizontal surface as that of the grounding conductor film 2 by a chemical mechanical polishing process (hereinafter, referred to as a CMP process), so that the top surfaces of the resist sacrificial layer 32 and the grounding conductor film 2 are planarized on substantially the same horizontal surface. As shown in FIG. 4B, on the polished surface thereof, the dielectric support film 3 is formed by the sputtering process or the like, and thereafter, a through hole 5 is formed by the photolithography and the reactive ion etching process so as to pass through the dielectric support film 3 in its thickness direction. Also, as shown in FIG. 4C, the interconnecting conductor film 4 made of Au is formed on the dielectric support film 3 by the sputtering process or the like, and then, it is etched with a predetermined pattern by the photolithography and the ion beam etching process, so that the interconnecting conductor film 4 becomes a strip conductor having a shape of a predetermined meander for the inductor device, and then, this leads to formation of the interconnecting conductor film 4 for the inductor device. In this process, the material of the interconnecting conductor film 4 is filled as the through hole conductor 5*c* into the through hole 5, and then, one end 4*b* of the interconnecting conductor film 4 is connected with the grounding conductor film 2 via the through hole conductor 5*c*. Thereafter, as shown in FIG. 4D, at a plurality of portions of the dielectric support film 3 which are just above the resist sacrificial layer 32 and where the interconnecting conductor film 4 is not formed, a plurality of rectangular-shaped opening portions 8 are formed by the photolithography and the reactive ion etching process so as to pass through the dielectric support film 3 in its thickness direction. Further, as shown in FIG. 4E, the resist sacrificial layer 32 is etched via the opening portions 8 by a wet etching process, so that the resist sacrificial layer 32 is removed, and then, the grounding type inductor device can be manufactured.

In the manufacturing process as described above, the steps of FIGS. 3A to 3F and 4A to 4E are employed. However, the present invention is not limited to this, and the step of FIG. 3F may be omitted, and in this case the processing flow proceeds from the step of FIG. 3E to the step of FIG. 4A. In this case, in the grounding type inductor device after the step of FIG. 3E, the surface of the resist sacrificial layer 32 may be also directly polished by the CMP process until the top surface of the resist sacrificial layer 32 becomes substantially the same horizontal surface as that of the grounding conductor film 2, and this leads to planarization of the resist sacrificial layer 32 and the grounding conductor film 2. Also, instead of the CMP process, etching of the resist sacrificial layer 32 with the use of a predetermined developer may be applied to the process for the planarization. These modifications of the manufacturing process are applicable to the other preferred embodiments as well.

In the grounding type inductor device constituted as described above, the interconnecting conductor film 4 constituting an inductor for use in high frequencies is formed on the dielectric support film 3 formed on the silicon substrate 1 and its recessed portion 1*a*, and the grounding type inductor device has a so-called membrane structure. In FIGS. 1 and 2, a microstrip line is constituted by the interconnecting conductor film 4 and the grounding conductor film 2 so that the dielectric support film 3 and the air space 20 are sandwiched between the interconnecting conductor film 4 and the grounding conductor film 2. When a high frequency signal is inputted to the microstrip line, the high frequency signal is propagated along the longitudinal direction of the interconnecting conductor film 4, so that an electromagnetic field of the high frequency signal is generated between the interconnecting conductor film 4 and the grounding conductor film 2 via the dielectric support film 3 and the air space 20. However, the dielectric support film 3 is extremely thin, and the electromagnetic field is generated at locations almost in the air space 20. Therefore, the transmission loss can be remarkably reduced, as compared with a prior art microstrip line employing a dielectric substrate. Also, since one silicon substrate 1 alone is used in this first preferred embodiment, the device structure is quite simple and the manufacturing process is simple, as compared with the above-mentioned first and second prior arts, and this leads to obtainment of such a unique advantageous effect that the manufacturing cost can be remarkably reduced.

Figure 5A:
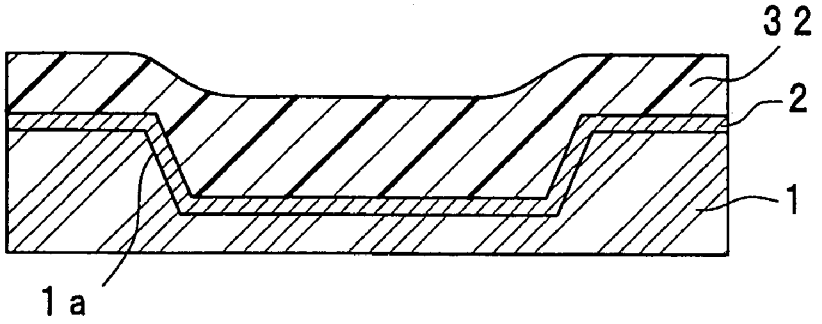
FIG. 5A is a longitudinal sectional view for explaining a problem which is caused in a partial process from FIG. 3E to FIG. 4A, showing a first step of the partial process.
Figure 5B:
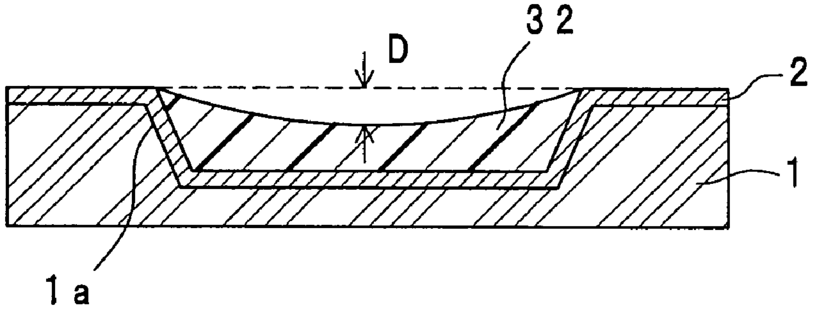
FIG. 5B is a longitudinal sectional view showing a second step of the partial process.
Figure 6A:
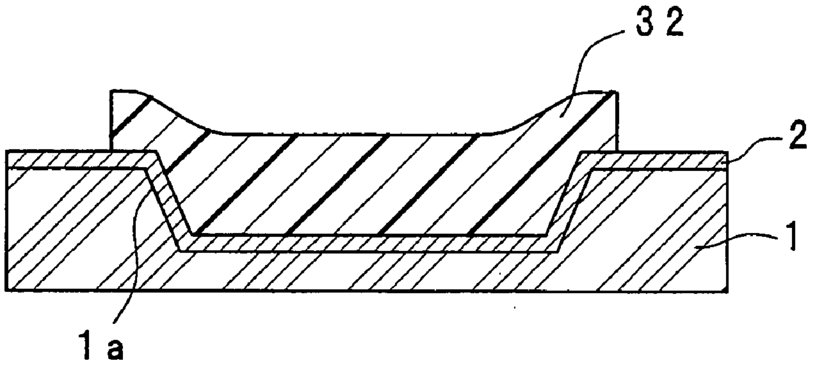
FIG. 6A is a longitudinal sectional view for solving the problem which is caused in the partial process of FIGS. 5A and 5B, showing a first step of the partial process.
Figure 6B:
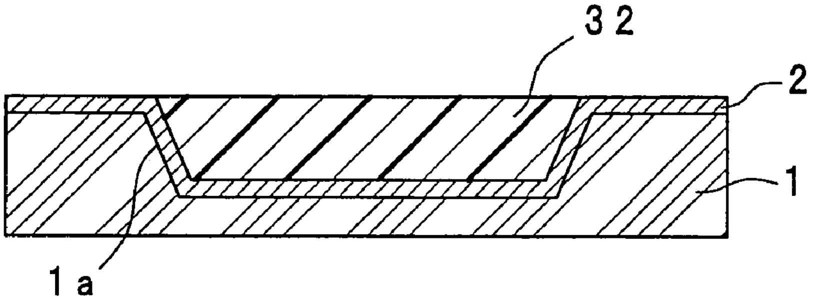
FIG. 6B is a longitudinal sectional view showing a second step of the partial process.

FIGS. 5A and 5B are longitudinal sectional views showing respective steps for explaining a problem caused in the partial process from FIG. 3E to FIG. 4A, showing a first step of the partial process, and FIGS. 6A and 6B are longitudinal sectional views showing respective steps for solving the problem caused in the partial process of FIGS. 5A and 5B. It is quite important for obtainment of a planarized membrane structure that the patterning of the resist sacrificial layer 32 shown in the step of FIG. 3F is previously performed prior to the polishing process by the CMP process. The advantageous effects will be explained with reference to FIGS. 5A and 5B.

Au of the grounding conductor film 2 and the resist material of the resist sacrificial layer 32 are different in hardness from each other. Upon planarizing these two materials so as to be substantially the same horizontal surface, there may be caused such a case that the surface of the soft resist sacrificial layer 32 is depressed into recesses as shown in FIGS. 5A and 5B. This is called "dishing", and a dishing amount D of FIG. 5B is about 3 μm. This dishing may cause the dielectric support film 3 to be formed into a recessed shape, giving rise to such problems that the characteristic impedance of the microstrip line of the grounding type inductor device may deviate from a desirable design value, and that its Q value may become smaller. In order to solve these problems, the resist sacrificial layer 32 is previously patterned prior to the polishing process by CMP process in a manner similar to that of FIG. 6A, and this leads to that the dishing amount D can be reduced to about 0.1 μm.

It is noted that the manufacturing method described with reference to FIGS. 5A, 5B, 6A and 6B may be also applied to the other preferred embodiments without being limited to the first preferred embodiment.

In the above-mentioned first preferred embodiment, the resist is used as the material of the resist sacrificial layer 32. However, this is not limited, and the present invention allows the use of the other polymeric organic material such as polyimide or the like. It is noted that, since patterning is performed in the step of FIG. 3F, the polymeric organic material is preferably a photosensitive one.

Modified Preferred Embodiment of First Preferred Embodiment

Figure 7:
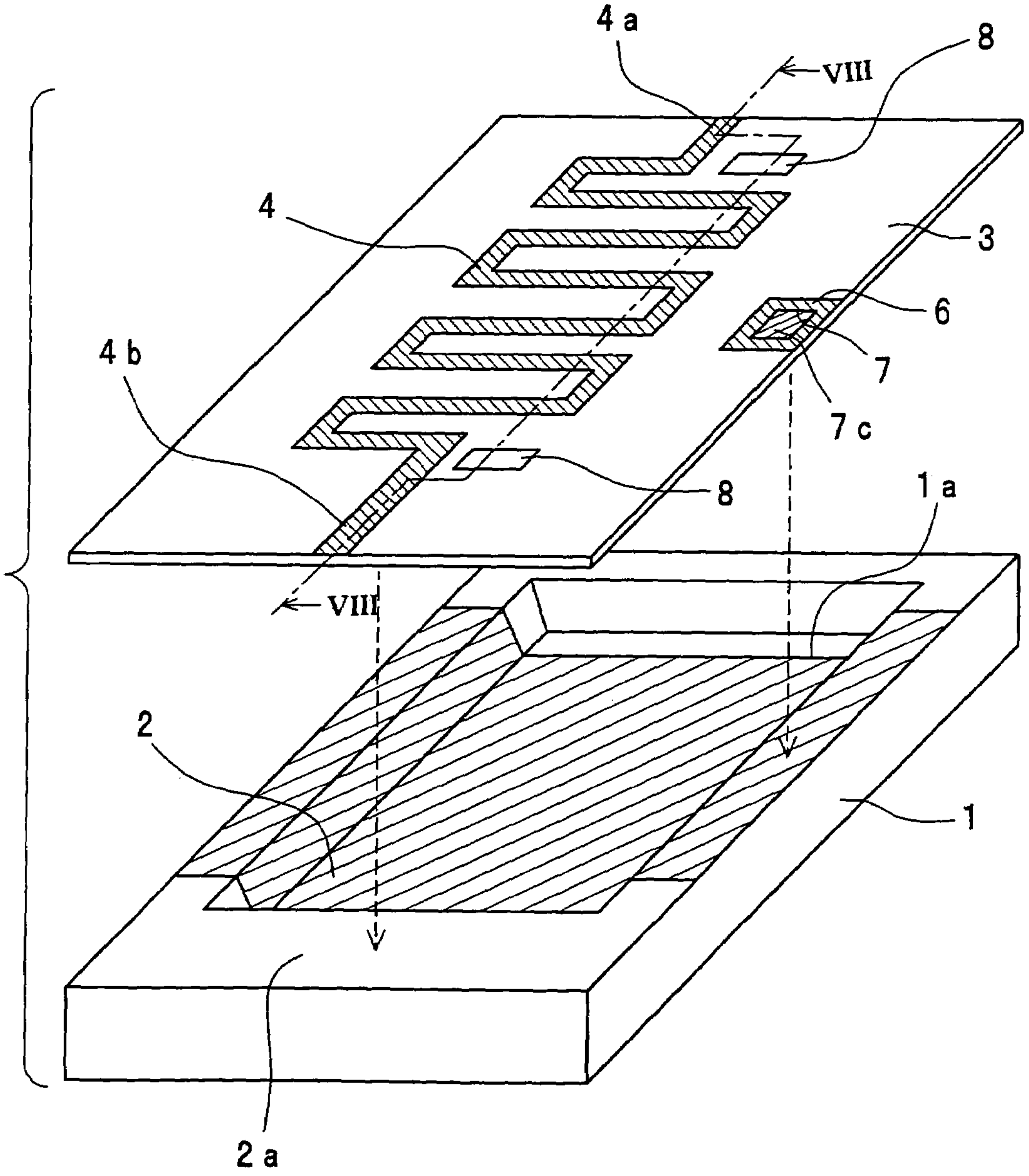
FIG. 7 is an exploded perspective view showing a structure of a series-connection type inductor device of a modified preferred embodiment of the first preferred embodiment according to the present invention.
Figure 8:
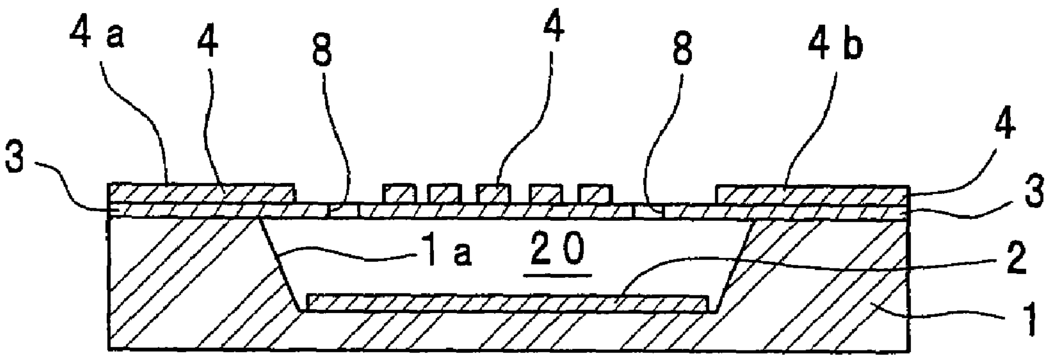
FIG. 8 is a longitudinal sectional view showing a cross section taken along the line VIII-VIII of FIG. 7.

FIG. 7 is an exploded perspective view showing a structure of a series-connection inductor device of a modified preferred embodiment of the first preferred embodiment according to the present invention, and FIG. 8 is a longitudinal sectional view showing a cross section taken along the line VIII-VIII of FIG. 7. The series-connection inductor device according to this modified preferred embodiment has, as shown in FIGS. 7 and 8, the end 4*b* of the interconnecting conductor film 4 not connected to the grounding conductor film 2*a* via the through hole conductor 5*c* of FIG. 1. That is, the interconnecting conductor film 4 is not grounded, as compared with those of the short-circuited inductor device according to the first preferred embodiment shown in FIGS. 1 and 2.

This series-connection type inductor device can be manufactured by the same manufacturing method as that of the first preferred embodiment. In this case, the other end 4*b* of the interconnecting conductor film 4 is connected with another high frequency circuit, that is, the series-connection type inductor device is connected between two high frequency circuits. It is noted that neither the through hole 5 nor the through hole conductor 5*c*, as each shown in FIG. 1, is formed in this modified preferred embodiment. The series-connection type inductor device constituted as shown above can obtain the same action and advantageous effects as those of the inductor device according to the first preferred embodiment.

Second Preferred Embodiment

Figure 9:
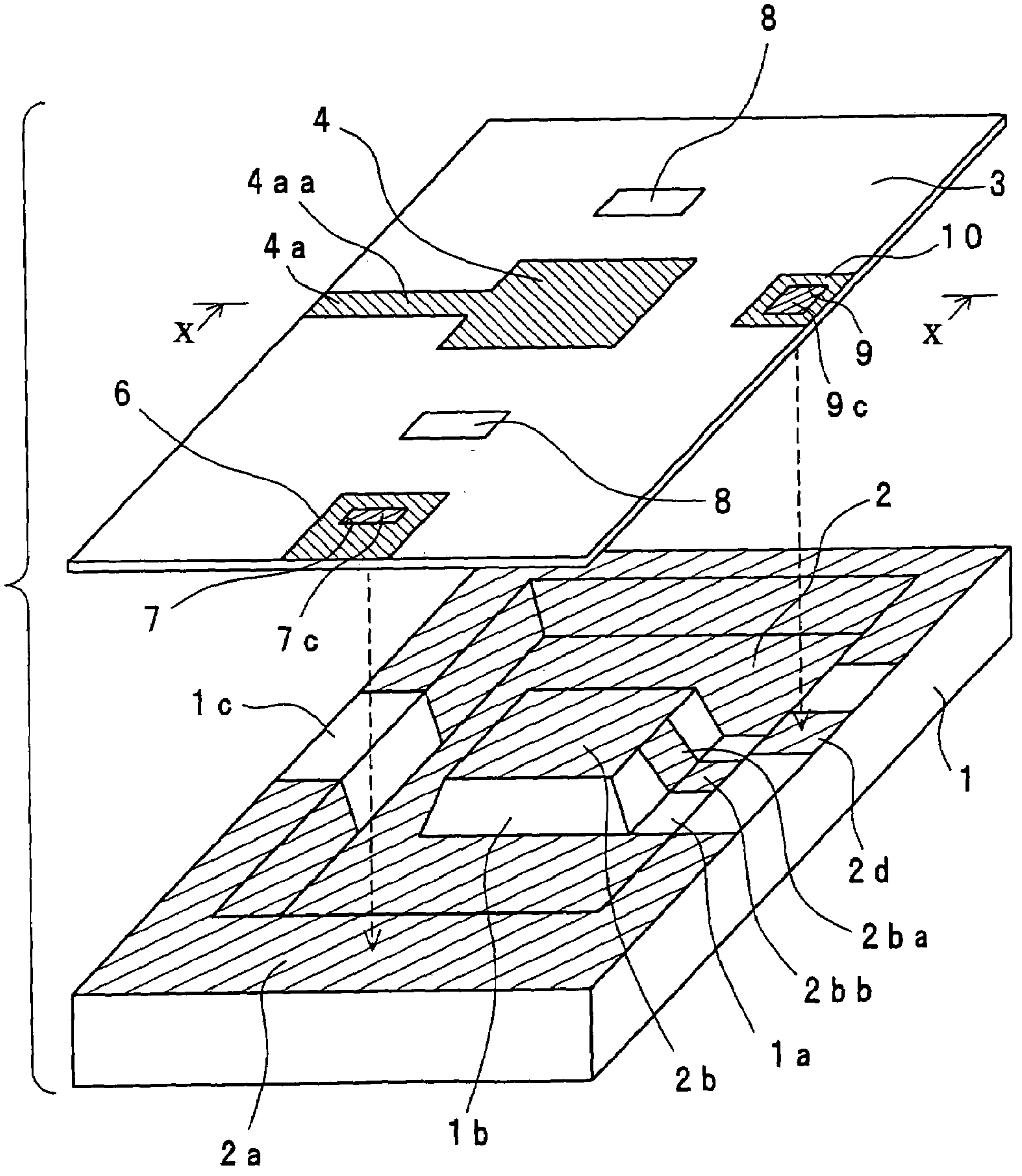
FIG. 9 is an exploded perspective view showing a structure of a series-connection type capacitor device of a second preferred embodiment according to the present invention.
Figure 10:
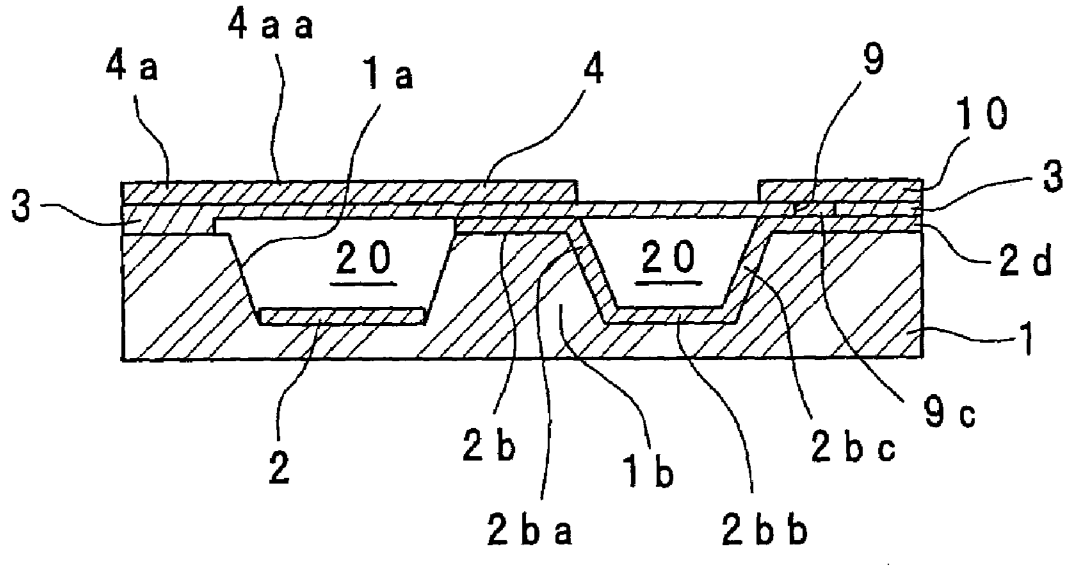
FIG. 10 is a longitudinal sectional view showing a cross section taken along the line X-X of FIG. 9.

FIG. 9 is an exploded perspective view showing the structure of a series-connection type capacitor device of a second preferred embodiment according to the present invention, and FIG. 10 is a longitudinal sectional view showing a cross section taken along the line X-X of FIG. 9. The series-connection capacitor device according to this second preferred embodiment has, as shown in FIGS. 9 and 10, the dielectric support film 3 sandwiched by the following interconnecting conductor films 4 and 2*b* so that a high frequency capacitor includes:

(a) the interconnecting conductor film 4 for use as an upper electrode, which is formed on the dielectric support film 3; and (b) the rectangular-shaped interconnecting conductor film 2*b* for use as a lower electrode, which is formed on a top surface of a truncated-pyramid shaped protruding portion 1*b* formed on the recessed portion 1*a* of the silicon substrate 1.

It is noted that the interconnecting conductor film 4 and the interconnecting conductor film 2*b*, which form an upper electrode and a lower electrode, respectively, have a sufficiently larger area than the line width of the microstrip line.

Referring to FIGS. 9 and 10, the recessed portion 1*a* having a predetermined depth is formed in the silicon substrate 1, and the truncated-pyramid shaped protruding portion 1*b* is formed at the central portion of the recessed portion 1*a*. The grounding conductor film 2 made of Au is formed on the surface of the silicon substrate 1 including the recessed portion 1*a*. On the other hand, the interconnecting conductor films 2*b* and 2*d* connected with each other are formed so as to extend on the top surface of the protruding portion 1*b* and from this top surface thereof to a part of the recessed portion 1*a* and to a part of the top surface of the silicon substrate 1 so as to isolated from the grounding conductor films 2 and 2*a*. In this case, the dielectric support film 3 is formed just above the recessed portion 1*a*, and further, on the dielectric support film 3, the rectangular-shaped interconnecting conductor film 4 made of Au is formed serving as an upper electrode of the capacitor device. Then, the protruding portion 1*b* has such a structure that the protruding portion 1*b* supports a portion of the dielectric support film 3 via the interconnecting conductor film 2*b*. Also, the interconnecting conductor film 2*b* is formed so as to extend over an interconnecting conductor film 2*ba* formed on the side surface of the protruding portion 1*b*, an interconnecting conductor film 2*bb* on the recessed portion 1*a*, an interconnecting conductor film 2*bc* on a slope surface of the recessed portion 1*a* and further so as to extend to the interconnecting conductor film 2*d* on the surface of the silicon substrate 1, and is thereafter connected with an interconnecting conductor film 10 for use as a taking-out electrode which is formed on the dielectric support film 3 via a through hole conductor 9*c* formed in a through hole 9 formed so as to pass through the dielectric support film 3 in its thickness direction.

Further, on the dielectric support film 3 located at the central portion on the near side of FIG. 9, an interconnecting conductor film 6 for use as taking-out electrode having a predetermined rectangular shape is formed, and at that position, a through hole 7 is formed so as to pass through the dielectric support film 3 in its thickness direction, where a through hole conductor 7*c* is filled in the through hole 7, so that the interconnecting conductor film 6 is connected with the grounding conductor film 2 via the through hole conductor 7*c* so as to be grounded. Furthermore, the rectangular-shaped opening portions 8 are formed so as to pass through the dielectric support film 3 at a plurality of portions above the recessed portion 1*a* of the silicon substrate 1 and in the dielectric support film 3 where the interconnecting conductor film 4 is not formed. The opening portions 8 are used for etching of the resist material of the resist sacrificial layer 32 filled in the recessed portion 1*a* in the manufacturing process which will be described later. In this case, by removal of the resist sacrificial layer 32, an air space 20, which has a volume corresponding to a result of subtracting the volume of the protruding portion 1*b* from the volume of the recessed portion 1*a* and which serves as an air layer, is formed between the grounding conductor film 2 above the recessed portion 1*a* and the dielectric support film 3 having the interconnecting conductor film 4 formed therein.

Also, the grounding conductor film 2 is partially removed on a portion 1*c* of the silicon substrate 1 just under the one end 4*a* (located at the left-side central portion of the dielectric support film 3 of FIG. 9) of a strip conductor 4*aa* for connection use which is connected with the interconnecting conductor film 4 for use as upper electrode formed on the dielectric support film 3. As a result of this, there can be prevented occurrence of parasitic capacitance between the interconnecting conductor film 4 for use as upper electrode and the grounding conductor film 2.

FIGS. 11A to 11F and 12A to 12E are longitudinal sectional views showing a manufacturing process for manufacturing the series-connection type capacitor device of FIG. 9. With reference to these FIGS. 11A to 11F and 12A to 12E, the manufacturing process of the series-connection type capacitor device of FIGS. 9 and 10 will be explained below.

Figure 11A:
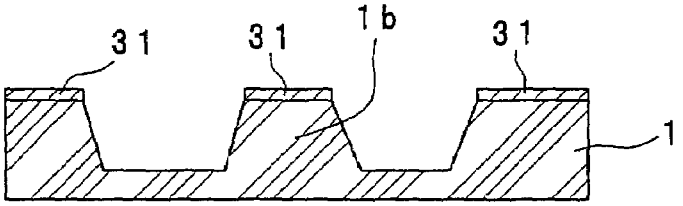
FIG. 11A is a longitudinal sectional view showing a first step of the manufacturing process of the series-connection type capacitor device of FIG. 9.
Figure 11B:
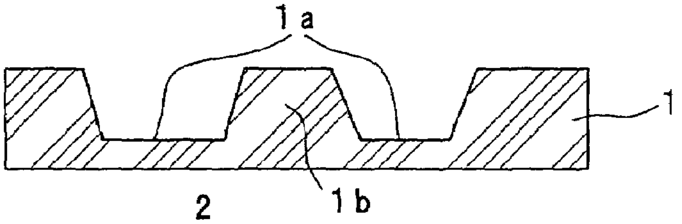
FIG. 11B is a longitudinal sectional view showing a second step of the manufacturing process of the series-connection type capacitor device of FIG. 9.
Figure 11C:
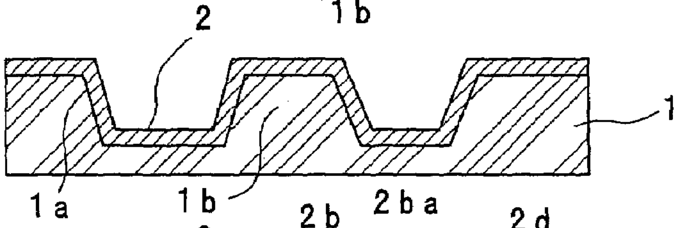
FIG. 11C is a longitudinal sectional view showing a third step of the manufacturing process of the series-connection type capacitor device of FIG. 9.
Figure 11D:
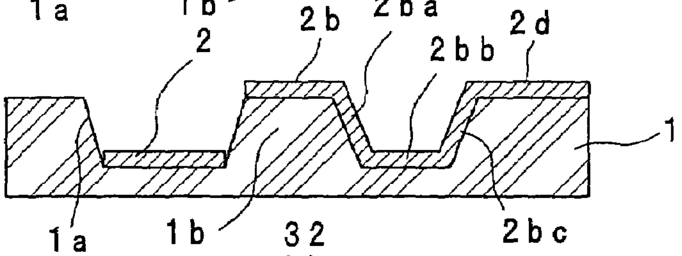
FIG. 11D is a longitudinal sectional view showing a fourth step of the manufacturing process of the series-connection type capacitor device of FIG. 9.
Figure 11E:
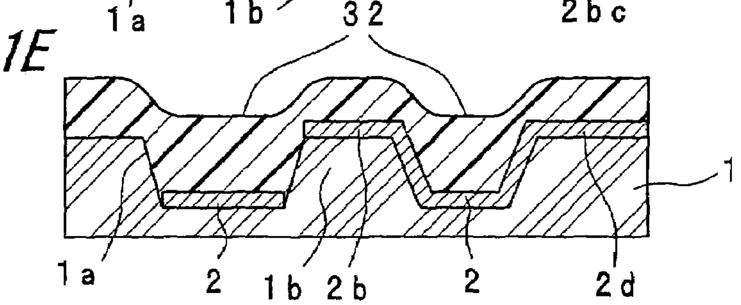
FIG. 11E is a longitudinal sectional view showing a fifth step of the manufacturing process of the series-connection type capacitor device of FIG. 9.
Figure 11F:
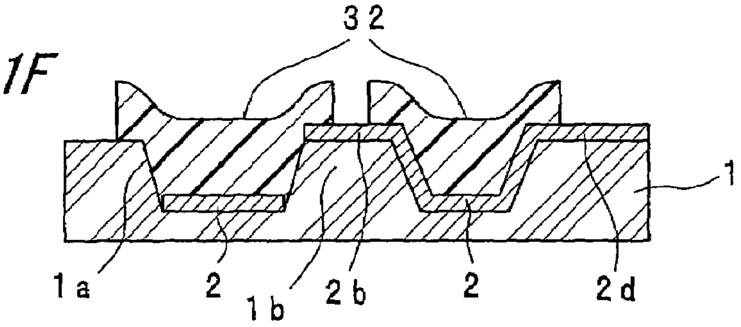
FIG. 11F is a longitudinal sectional view showing a sixth step of the manufacturing process of the series-connection type capacitor device of FIG. 9.

First of all, as shown in FIG. 11A, a mask pattern layer 31 made of silicon oxide film and having a predetermined pattern is formed on the surface of the silicon substrate 1 by using the thermal oxidation process and the photolithography. Next, as shown in FIG. 11B, the surface of the silicon substrate 1 is etched by the so-called micromachining technique with an alkaline aqueous solution made of, for example, KOH, so that the recessed portion 1*a* having a predetermined depth is formed in such a manner that a truncated-pyramid shaped protruding portion 1*b* remains. The depth, to which the silicon substrate is to be etched, is determined based on, for example, a transmission loss required for the microstrip line to be formed, and it is preferably 30 μm as an example. Then, as shown in FIG. 11C, the grounding conductor film 2 made of Au is formed by the sputtering process or the like on the recessed portion 1*a* of the silicon substrate 1 and its protruding portion 1*b* so as to extend onto the surface of the silicon substrate 1. Further, as shown in FIG. 11D, unnecessary portions of the grounding conductor film 2 are removed according to a predetermined pattern by the photolithography and the ion beam etching process. At that time, in particular, the grounding conductor film 2 is etched so that the grounding conductor film 2 on the recessed portion 1*a* and the interconnecting conductor film 2*b* for use as lower electrode remain, as well as the interconnecting conductor films 2*ba*, 2*bb*, 2*bc* and 2*d* to be connected with the interconnecting conductor film 2*b*. Also, as shown in FIG. 11E, the resist sacrificial layer 32 is formed by coating the resist material on the surface of the silicon substrate 1, on its recessed portion 1*a* and protruding portion 1*b*, and on the grounding conductor film 2, so that the interior of the recessed portion 1*a* is filled with the resist material of the resist sacrificial layer 32. Further, as shown in FIG. 11F, the resist sacrificial layer 32 is partially etched by the using photolithography, so that its pattern portion larger than the recessed portion 1*a* remains, with the other pattern portions removed.

Figure 12A:
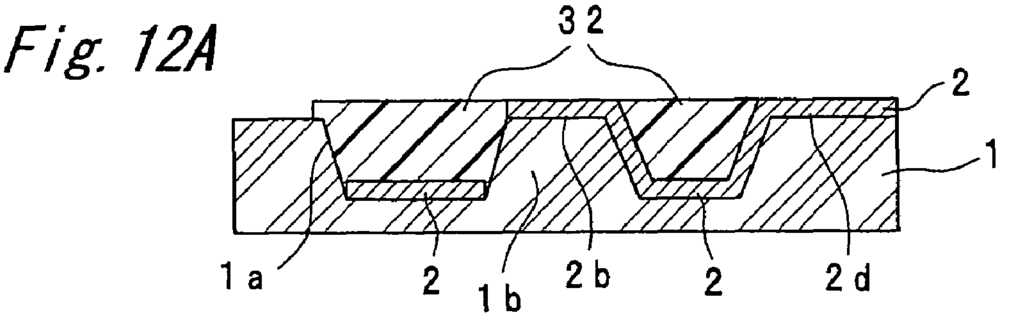
FIG. 12A is a longitudinal sectional view showing a seventh step of the manufacturing process of the series-connection type capacitor device of FIG. 9.
Figure 12B:
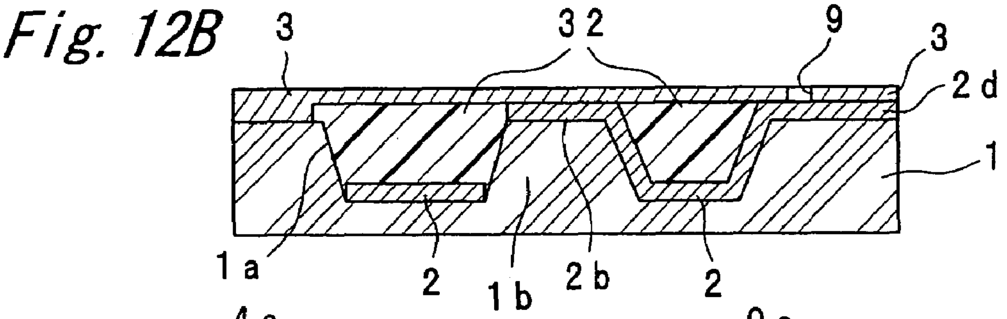
FIG. 12B is a longitudinal sectional view showing an eighth step of the manufacturing process of the series-connection type capacitor device of FIG. 9.
Figure 12C:
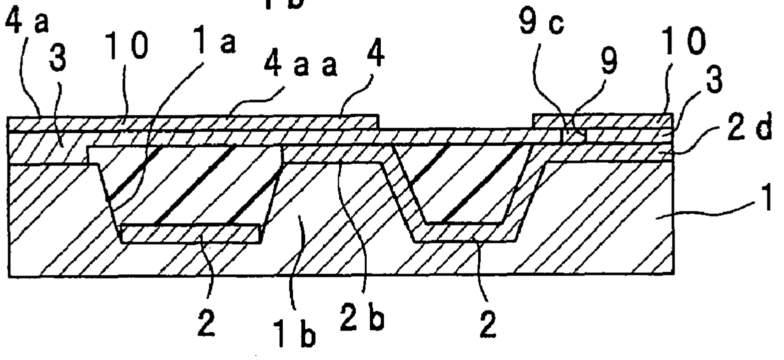
FIG. 12C is a longitudinal sectional view showing a ninth step of the manufacturing process of the series-connection type capacitor device of FIG. 9.
Figure 12D:
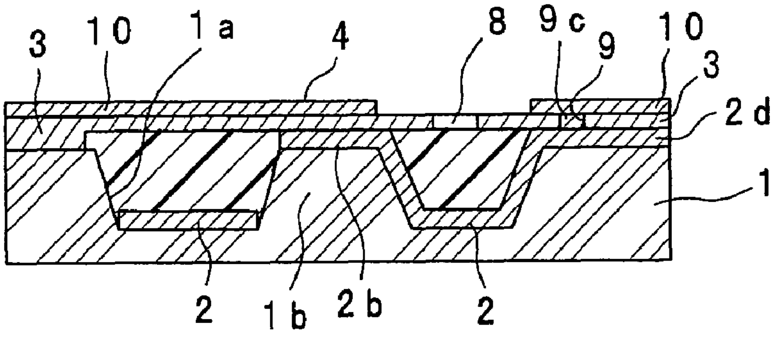
FIG. 12D is a longitudinal sectional view showing a tenth step of the manufacturing process of the series-connection type capacitor device of FIG. 9.
Figure 12E:
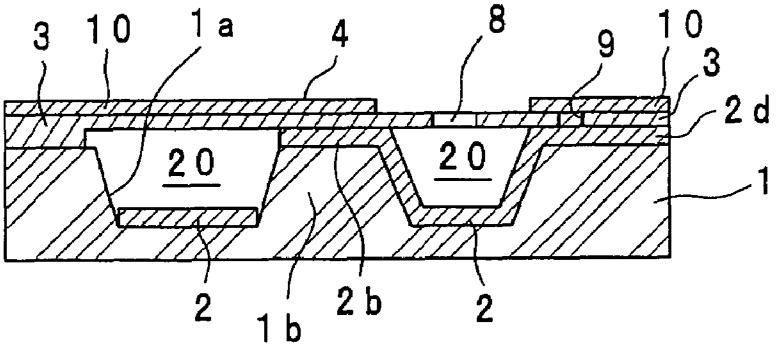
FIG. 12E is a longitudinal sectional view showing an eleventh step of the manufacturing process of the series-connection type capacitor device of FIG. 9.

Subsequently, as shown in FIG. 12A, on the silicon substrate 1 having the grounding conductor film 2 and the resist sacrificial layer 32 formed thereon, the top surface of the resist sacrificial layer 32 is polished so as to become substantially the same horizontal surface as that of the grounding conductor film 2 by the CMP process, and then this leads to planarization of the resist sacrificial layer 32 and the grounding conductor film 2. As shown in FIG. 12B, on the polished surface, the dielectric support film 3 is formed by the sputtering process or the like, and thereafter, the through hole 5 is formed by the photolithography and the reactive ion etching process so as to pass through the dielectric support film 3 in its thickness direction. Also, as shown in FIG. 12C, interconnecting conductor films 4 and 10 made of Au are formed on the dielectric support film 3 by the sputtering process or the like, and then, the interconnecting conductor films 4 and 10 are etched with a predetermined pattern by the photolithography and the ion beam etching process, so that the interconnecting conductor film 4 is formed into a rectangular upper-electrode shape and a shape of a strip conductor 4*aa* for connection use be connected therewith, and so that the interconnecting conductor film 10 is formed into a rectangular shape of taking-out electrode. Then this leads to formation of the interconnecting conductor films 4 and 10 for the capacitor device. In this process, the material of the interconnecting conductor film 10 is filled as a through hole conductor 9*c* into the through hole 9, and then, the interconnecting conductor film 10 is connected with the grounding conductor film 2*d* via the through hole conductor 9*c*. Thereafter, as shown in FIG. 12D, at a plurality of portions of the dielectric support film 3 which are just above the resist sacrificial layer 32 within the recessed portion 1*a* and where the interconnecting conductor film 4 and 10 is not formed, a plurality of rectangular-shaped opening portions 8 are formed by the photolithography and the reactive ion etching process so as to extend through the dielectric support film 3 in its thickness direction. Further, as shown in FIG. 12E, the resist sacrificial layer 32 is etched via the opening portions 8 by the wet etching process, so that the resist sacrificial layer 32 is removed. Thus, the series-connection type capacitor device can be manufactured.

In the series-connection type capacitor device constituted as described above, the interconnecting conductor film 4 for use as upper electrode and the interconnecting conductor film 2*b* for use as lower electrode are provided so as to sandwich the dielectric support film 3 therebetween, and then, a high frequency capacitor is constituted. Among both the electrodes of the high frequency capacitor, the one end 4*a* of the strip conductor 4*aa* for connection use connected with the interconnecting conductor film 4 is connected with an external high frequency circuit, and the interconnecting conductor film 10 for use as taking-out electrode connected with the interconnecting conductor film 2*b* is connected with another external high frequency circuit. In this case, the transmission lines from the interconnecting conductor film 4 for use as upper electrode and the interconnecting conductor film 2*b* for use as lower electrode to the interconnecting conductor films 4*a* and 10 each for use as taking-out electrodes respectively constitute the microstrip lines similar to those of the first preferred embodiment. Since the dielectric support film 3 is extremely thin and the electromagnetic field is generated mostly in the air space 20, the transmission loss can be remarkably reduced as compared with that of the prior art microstrip line employing the dielectric substrate. Also, since one silicon substrate 1 alone is used in this second preferred embodiment, the device structure is quite simple and the manufacturing process is simple, as compared with the above-mentioned first and second prior arts. Then there can be obtained such a unique advantageous effect that the manufacturing cost can be remarkably reduced.

Modified Preferred Embodiment of Second Preferred Embodiment

Figure 13:
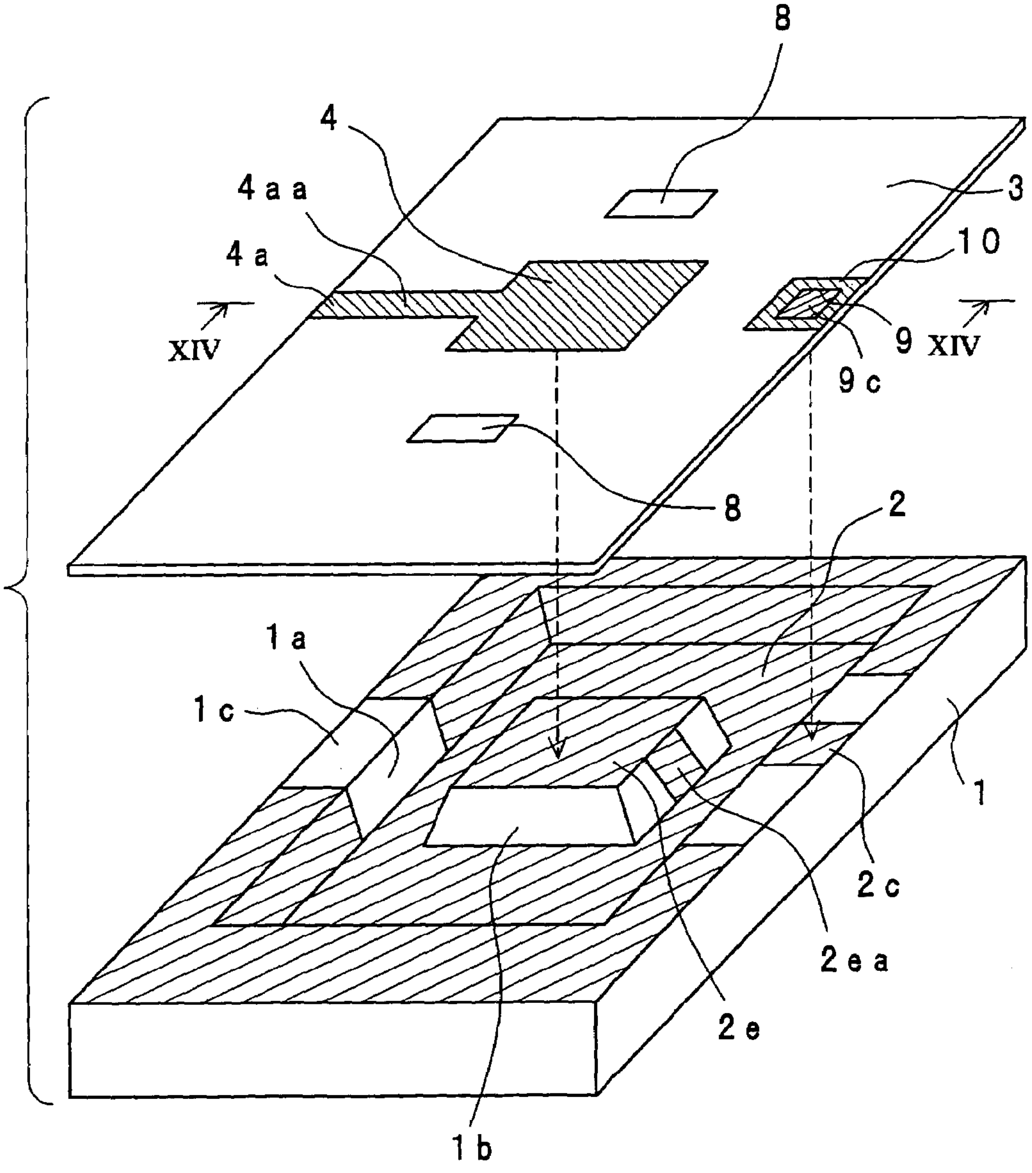
FIG. 13 is an exploded perspective view showing a structure of a grounding type capacitor device of a modified preferred embodiment of the second preferred embodiment according to the present invention.
Figure 14:
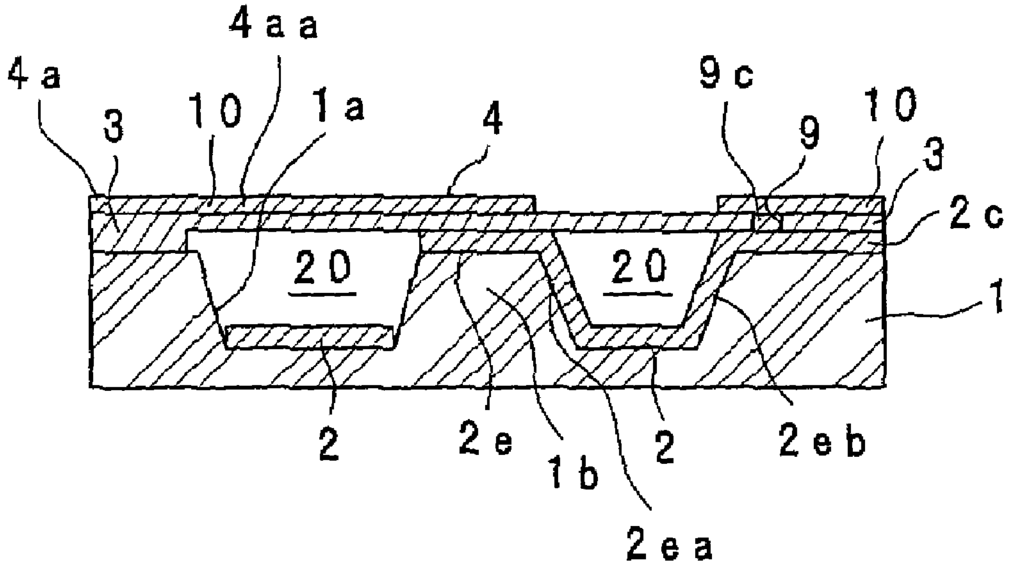
FIG. 14 is a longitudinal sectional view showing a cross section taken along the line XIV-XIV of FIG. 13.

FIG. 13 is an exploded perspective view showing a structure of a grounding capacitor device of a modified preferred embodiment of the second preferred embodiment according to the present invention, and FIG. 14 is a longitudinal sectional view showing a cross section taken along the line XIV-XIV of FIG. 13. The grounding capacitor device according to this modified preferred embodiment has the following differences, as shown in FIGS. 13 and 14, compared with the series-connection type capacitor device according to the second preferred embodiment shown in FIGS. 9 and 10:

(1) As shown in FIG. 13, the interconnecting conductor film 2*b* of the lower electrode shown in FIG. 9 is formed as a grounding conductor film 2*e*, and the grounding conductor film 2*e* is connected with the grounding conductor film 2 via a grounding conductor film 2*ea* formed on the side surface of the protruding portion 1*b;*

(2) As shown in FIG. 14, the grounding conductor film 2 is connected with a grounding conductor film 2*c* formed on the surfaces of the silicon substrate 1 via a grounding conductor film 2*eb* formed on the side surface of the recessed portion 1*a*; and (3) As shown in FIG. 13, the grounding conductor film 2*c* is connected with the interconnecting conductor film 10 for use as taking-out electrode via the through hole conductor 9*c* formed in the through hole 9.

This grounding type capacitor device can be manufactured by the same manufacturing method as that of the second preferred embodiment. In the grounding type capacitor device constituted as shown above, a high frequency capacitor is made up by the upper-electrode interconnecting conductor film 4 of the upper electrode and the grounding conductor film 2*e* of the lower electrode, between which the dielectric support film 3 is sandwiched, in a manner similar to that of the second preferred embodiment. In this case, the latter grounding conductor film 2*e* of the lower electrode is grounded. In addition, one end 4*a* of the strip conductor 4*aa* for connection use connected with the interconnecting conductor film 4 is connected with an external high frequency circuit. The grounding type capacitor device constituted as described above has the action and advantageous effects similar to those of the capacitor device according to the second preferred embodiment.

Third Preferred Embodiment

Figure 15:
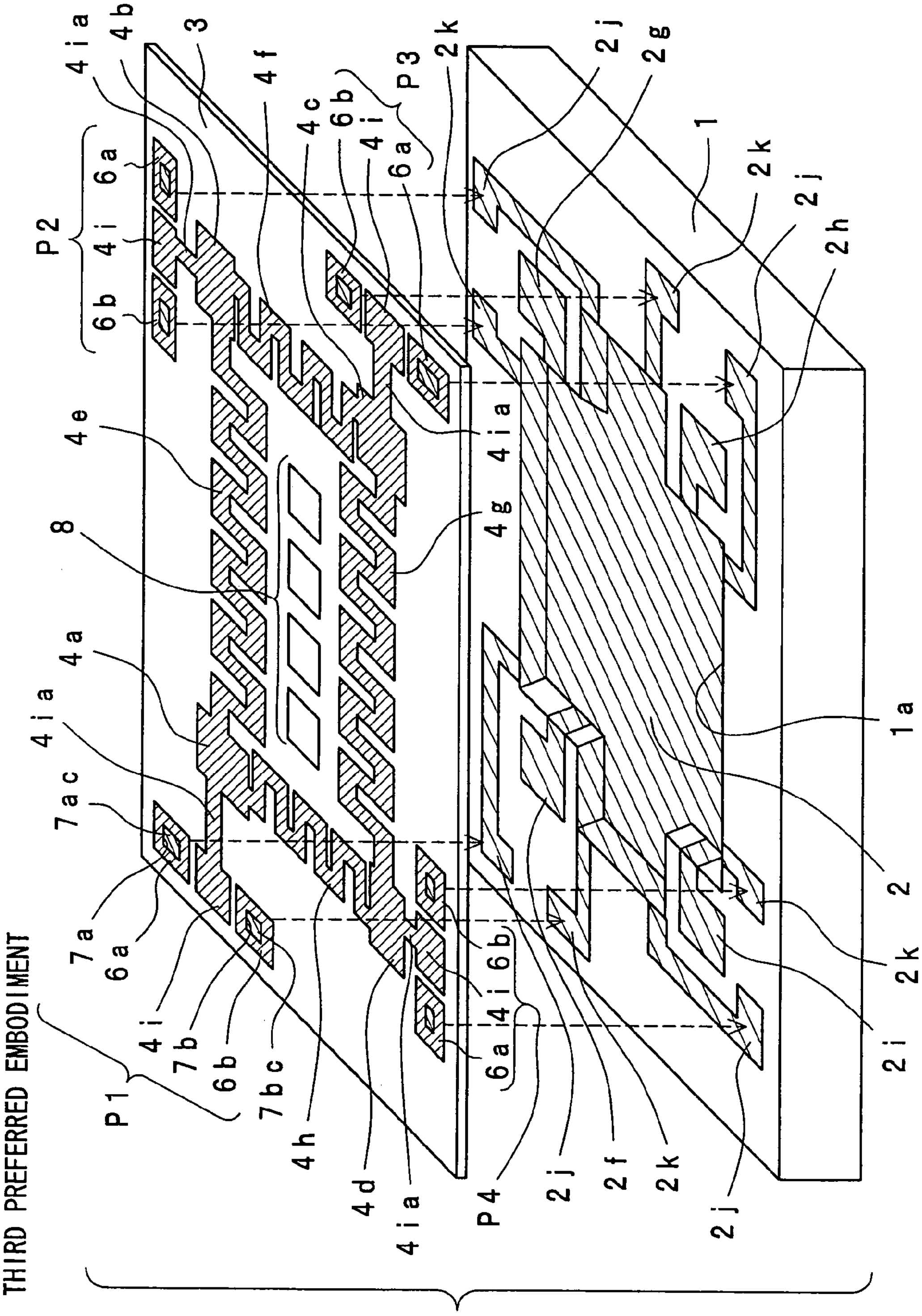
FIG. 15 is an exploded perspective view showing a structure of a hybrid circuit of a third preferred embodiment according to the present invention.
Figure 16:
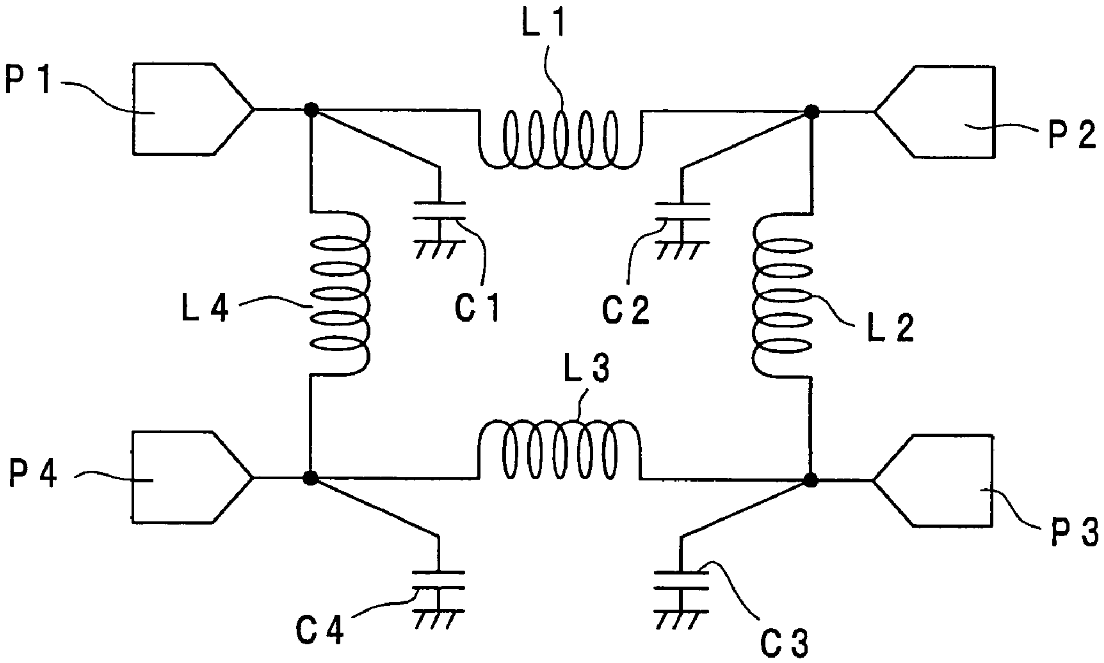
FIG. 16 is a circuit diagram showing an equivalent circuit of the hybrid circuit of FIG. 15.

FIG. 15 is an exploded perspective view showing a structure of a hybrid circuit of a third preferred embodiment according to the present invention, and FIG. 16 is a circuit diagram showing an equivalent circuit of the hybrid circuit of FIG. 15. The hybrid circuit according to this third preferred embodiment is a so-called 3 dB directional coupler for use as a power distributor for a high frequency transceiver. The present inventors made a prototype of the hybrid circuit of FIGS. 15 and 16 for use in 12 GHz band.

The hybrid circuit according to the third preferred embodiment has four ports P1, P2, P3 and P4 as shown in the equivalent circuit of FIG. 16. In this case, an inductor L1 implemented by the series-connection type inductor device according to the modified preferred embodiment of the first preferred embodiment of FIGS. 7 and 8 is connected between the port P1 and the port P2. Also, an inductor L2 implemented by the series-connection type inductor device according to the modified preferred embodiment of the first preferred embodiment of FIGS. 7 and 8 is connected between the port P2 and the port P3. An inductor L3 implemented by the series-connection type inductor device according to the modified preferred embodiment of the first preferred embodiment of FIGS. 7 and 8 is connected between the port P3 and the port P4. An inductor L4 implemented by the series-connection type inductor device according to the modified preferred embodiment of the first preferred embodiment of FIGS. 7 and 8 is connected between the port P4 and the port P1. Further, a capacitor C1 implemented by the grounding type capacitor device according to the modified preferred embodiment of the second preferred embodiment of FIGS. 13 and 14 is connected with the port P1, which is grounded via the capacitor C1. Also, a capacitor C2 implemented by the grounding type capacitor device according to the modified preferred embodiment of the second preferred embodiment of FIGS. 13 and 14 is connected with the port P2, which is grounded via the capacitor C2. Further, a capacitor C3 implemented by the grounding type capacitor device according to the modified preferred embodiment of the second preferred embodiment of FIGS. 13 and 14 is connected with the port P3, which is grounded via the capacitor C3. Still further, a capacitor C4 implemented by the grounding type capacitor device according to the modified preferred embodiment of the second preferred embodiment of FIGS. 13 and 14 is connected with the port P4, which is grounded via the capacitor C4.

Referring to FIG. 15, the recessed portion 1*a* is formed in the silicon substrate 1, and the grounding conductor film 2 is formed on the surface of the silicon substrate 1 including the recessed portion 1*a*. In this case, the grounding conductor film 2 is formed so as to extend from the grounding conductor film 2 on the recessed portion 1*a* to grounding conductor films 2*f*, 2*g*, 2*h* and 2*i* each for use as lower electrode of the respective capacitors C1, C2, C3 and C4, respectively, on the silicon substrate 1, as well as from the grounding conductor film 2 to the grounding conductor films 2*j* and 2*k* located just under interconnecting conductor films 6*a* and 6*b* each for use as taking-out electrode of the respective ports P1, P2, P3 and P4. On the other hand, on the surface of the dielectric support film 3, the following is formed:

(a) interconnecting conductor films 4*a*, 4*b*, 4*c* and 4*d* each for use as upper electrode;

(b) interconnecting conductor films 4*e*, 4*f*, 4*g* and 4*h* each of meander-shaped strip conductor, which are provided as inductors for connecting those interconnecting conductor films 4*a*, 4*b*, 4*c* and 4*d* for use as upper electrode; and (c) interconnecting conductor films 4*i* each for use as center conductor of the ports P1, P2, P3 and P4, respectively, which are connected from the interconnecting conductor films 4*a*, 4*b*, 4*c* and 4*d* for use as upper electrode via strip conductors 4*ia* for connection use, respectively.

The port P1 includes the interconnecting conductor film 4*i* for use as center conductor and two interconnecting conductor films 6*a* and 6*b* each for use as grounding conductor, and the port P1 is constituted as a G/S/G pad (Ground/Signal/Ground Pad). The interconnecting conductor film 6*a* for use as grounding conductor is connected with the grounding conductor film 2*j* on the silicon substrate 1 via a through hole conductor 7*ac* formed within a through hole 7*a* so as to pass through the dielectric support film 3 in its thickness direction, and then, the interconnecting conductor film 6*a* is grounded. Also, the interconnecting conductor film 6*b* for use as grounding conductor is connected with the grounding conductor film 2*k* on the silicon substrate 1 via a through hole conductor 7*bc* formed within a through hole 7*b* so as pass through the dielectric support film 3 in its thickness direction, and then, the interconnecting conductor film 6*b* is grounded. Further, each of the other ports P2, P3 and P4 includes an interconnecting conductor film 4*i* for use as center conductor and two interconnecting conductor films 6*a* and 6*b* each for use as grounding conductor, and each of the ports P2, P3 and P4 is constituted as a G/S/G pad (Ground/Signal/Ground Pad) in a manner similar to that of the port P1.

The dielectric support film 3 is sandwiched between the interconnecting conductor film 4*a* for use as upper electrode and the grounding conductor film 2*f* for use as lower electrode, and they constitute the capacitor C1. Also, the dielectric support film 3 is sandwiched between the interconnecting conductor film 4*b* for use as upper electrode and the grounding conductor film 2*g* for use as lower electrode, and they constitute the capacitor C2. Further, the dielectric support film 3 is sandwiched between the interconnecting conductor film 4*c* for use as upper electrode and the grounding conductor film 2*h* for use as lower electrode, and they constitute the capacitor C3. Still further, the dielectric support film 3 is sandwiched between the interconnecting conductor film 4*d* for use as upper electrode and the grounding conductor film 2*i* for use as lower electrode, and they constitute the capacitor C4.

On the dielectric support film 3, the interconnecting conductor film 4*e* of a meander-shaped strip conductor is formed so as to connect the interconnecting conductor films 4*a* and 4*b* each for use as upper electrode with each other via the interconnecting conductor film 4*e*, and then, the interconnecting conductor film 4*e* constitutes the inductor L1. Also, on the dielectric support film 3, the interconnecting conductor film 4*f* of a meander-shaped strip conductor is formed so as to connect the interconnecting conductor films 4*b* and 4*c* each for use as upper electrode with each other through the interconnecting conductor film 4*f*, and then, the interconnecting conductor film 4*f* constitutes the inductor L2. Further, on the dielectric support film 3, the interconnecting conductor film 4*g* of a meander-shaped strip conductor is formed so as to connect the interconnecting conductor films 4*c* and 4*d* for use as upper electrode with each other through the interconnecting conductor film 4*g*, and then, the interconnecting conductor film 4*g* constitutes the inductor L3. Still further, on the dielectric support film 3, the interconnecting conductor film 4*h* of a meander-shaped strip conductor is formed so as to connect the interconnecting conductor films 4*d* and 4*a* for use as upper electrode with each other through the interconnecting conductor film 4*h*, and then, the interconnecting conductor film 4*h* constitutes the inductor L4.

In addition to the above arrangement, in the central portion of the dielectric support film 3 where the interconnecting conductor film is not formed, a plurality of opening portions 8 which is used for the purpose of removing the resist material of the resist sacrificial layer filled in the recessed portion 1*a* are formed so as to pass through the dielectric support film 3 in its thickness direction.

The components of the hybrid circuit according to this third preferred embodiment are implemented in combination of the four series-connection type inductor devices according to the modified preferred embodiment of the first preferred embodiment, and the four grounding type capacitor device according to the modified preferred embodiment of the second preferred embodiment. Thus, the hybrid circuit can be manufactured by a manufacturing process similar to the manufacturing processes for manufacturing these components.

Figure 17:
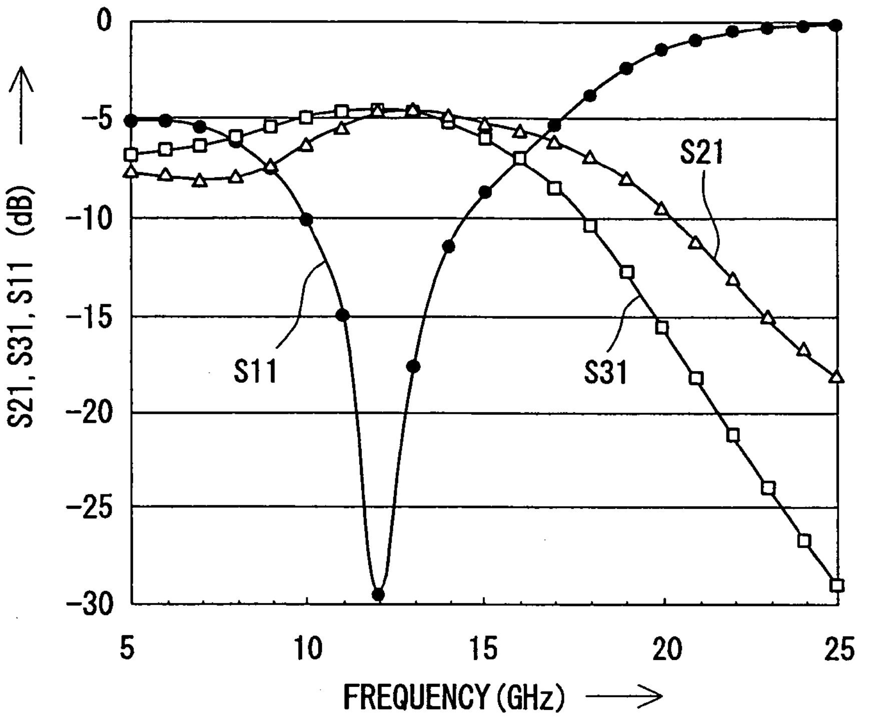
FIG. 17 is a graph of experimental results of the hybrid circuit of FIG. 15, showing frequency characteristics of pass coefficients S21 and S31, and a reflection coefficient S11 of the hybrid circuit.

FIG. 17 is a graph of experimental results of the hybrid circuit of FIG. 15 made as a prototype by the present inventors, showing frequency characteristics of pass coefficients S21 and S31, and a reflection coefficient S11 of the hybrid circuit. It is noted that suffixes of the S parameters of the pass coefficients S21 and S31, and the reflection coefficient S11 indicate port numbers, respectively.

Referring to the hybrid circuit of FIG. 15, when a high frequency signal is inputted through, for example, the port P1, the high frequency signal is divided or distributed into two high frequency signals having a mutual phase difference of 90° and each having substantially ½ of the power of the inputted high frequency signal, and the divided two high frequency signals are outputted from the port P2 and the port P3. As apparent from FIG. 17, at an operating frequency of 12 GHz, the pass coefficients S21 and S31 show the least loss, and the pass coefficients S21 and S31 have substantially the same loss as each other, thus making it understood that the input power of the high frequency signal is equally divided or distributed. Also, the reflection coefficient S11 becomes a small value of −30 dB at the operating frequency of 12 GHz.

Figure 18:
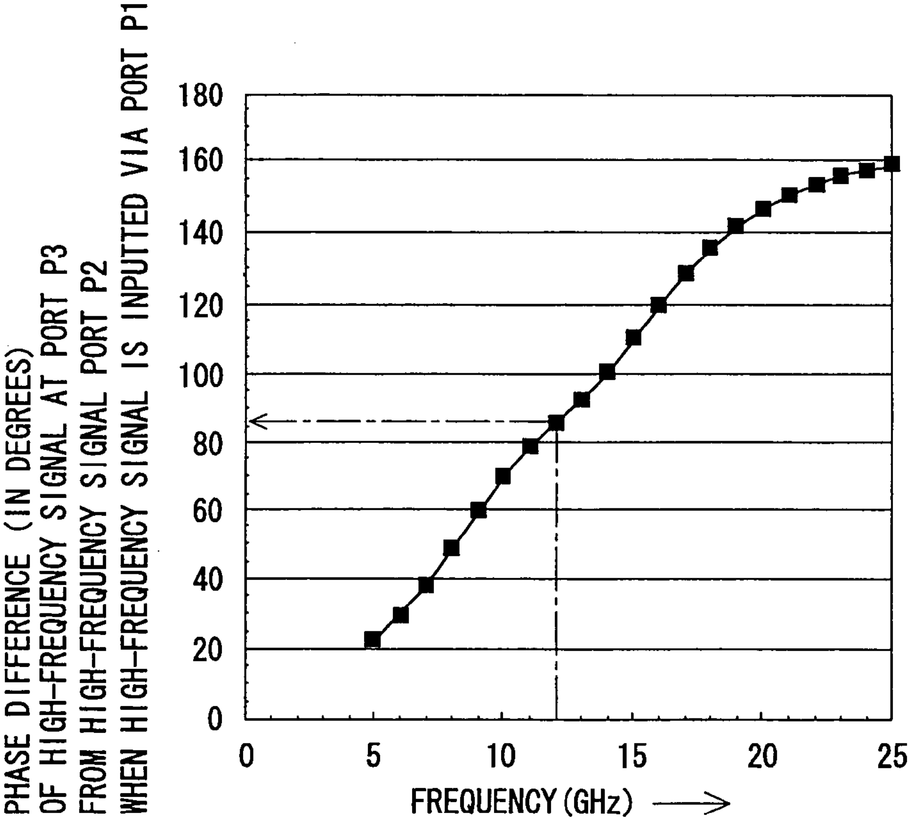
FIG. 18 is a graph of experimental results of the hybrid circuit of FIG. 15, showing frequency characteristics of phase difference of a high frequency signal at a port P3 from a high frequency signal at a port P2 when the high frequency signal is inputted via a port P1 of the hybrid circuit.

FIG. 18 is a graph of experimental results of the hybrid circuit of FIG. 15, showing frequency characteristics of a phase difference of a high frequency signal at the port P3 from a high frequency signal at the port P2 when the high frequency signal is inputted through the port P1 of the hybrid circuit. As apparent from FIG. 18, at the operating frequency of 12 GHz, a phase difference of nearly 90° was obtained.

In the hybrid circuit constituted as shown above, since one silicon substrate 1 alone is used, the device structure is quite simple and the manufacturing process is simple, as compared with the above-mentioned first and second prior arts, thus making it possible to remarkably reduce the manufacturing cost. Also, at high frequency bands such as 12 GHz, such low-loss frequency characteristics as described above could not be obtained with the above-mentioned high frequency circuits of prior arts in which the hybrid circuit is formed directly on the silicon substrate without using any membrane structure. However, extremely low loss characteristics can be obtained with the membrane structure according to the present preferred embodiment in which the air space is provided under the bottom surface of the dielectric support film 3 as shown in FIG. 15.

Fourth Preferred Embodiment

Figure 19:
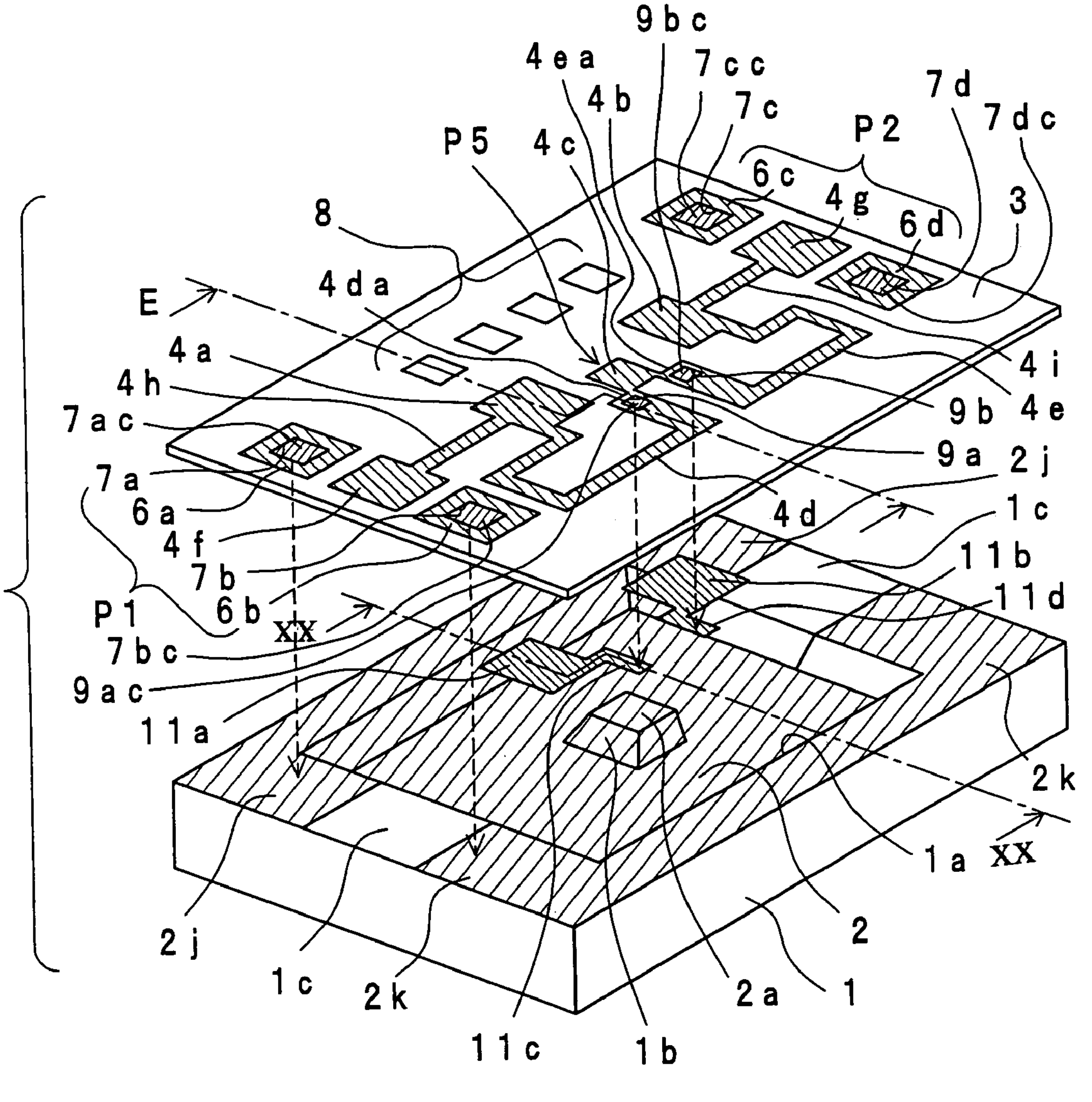
FIG. 19 is an exploded perspective view showing a structure of a low-pass filter circuit of a fourth preferred embodiment according to the present invention.
Figure 20:
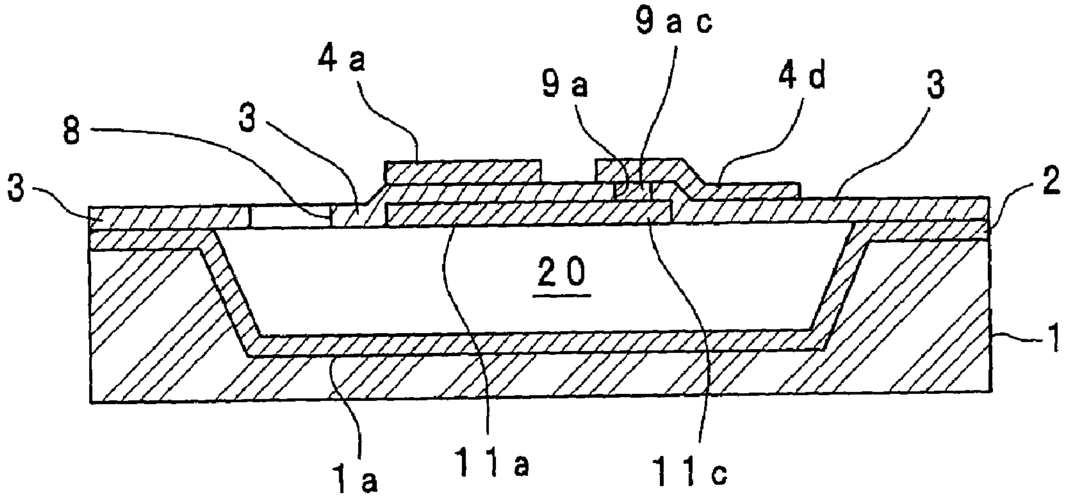
FIG. 20 is a longitudinal sectional view showing a cross section taken along the line XX-XX of FIG. 19.
Figure 21:
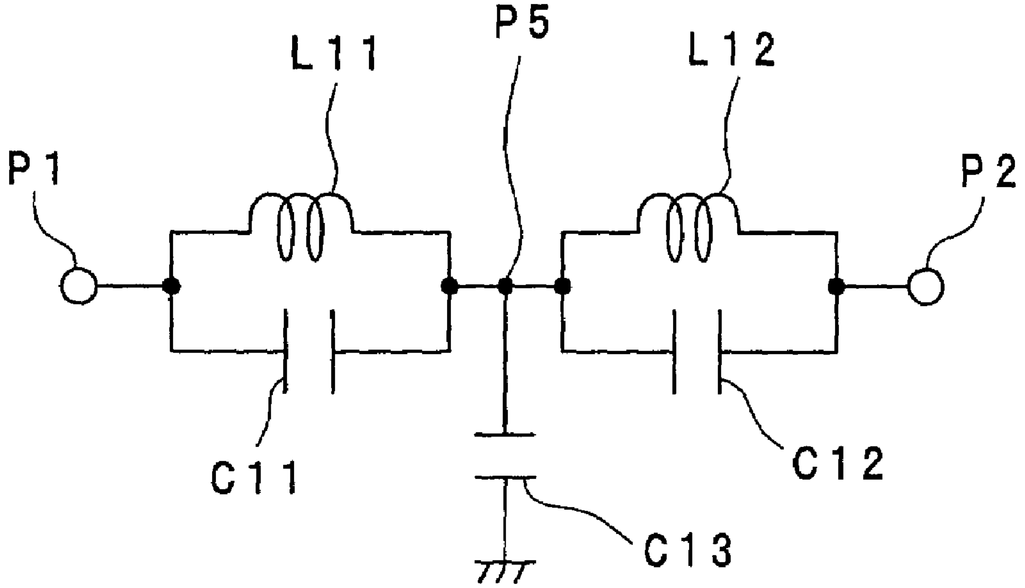
FIG. 21 is a circuit diagram showing an equivalent circuit of the low-pass filter circuit of FIG. 19.

FIG. 19 is an exploded perspective view showing a structure of a low-pass filter circuit of a fourth preferred embodiment according to the present invention, FIG. 20 is a longitudinal sectional view showing a cross section taken along the line XX-XX of FIG. 19, and FIG. 21 is a circuit diagram showing an equivalent circuit of the low-pass filter circuit of FIG. 19. This low-pass filter circuit was experimentally manufactured by the present inventors to operate at 12 GHz.

The low-pass filter circuit according to this fourth preferred embodiment is characterized in that, as shown in FIGS. 19 and 20, interconnecting conductor films 11*a* and 11*b* each for use as lower electrode are formed on the bottom surface of the dielectric support film 3 at positions just under the interconnecting conductor films 4*a* and 4*b* for use as upper electrode on the dielectric support film 3, as compared with the above-mentioned first to third preferred embodiments. Then this leads to constitution of a high frequency capacitor by the two interconnecting conductor films 4*a* and 11*a* sandwiching the dielectric support film 3 therebetween, and leads to another constitution of a further high frequency capacitor by the two interconnecting conductor films 4*b* and 11*b* sandwiching the dielectric support film 3 therebetween.

The low-pass filter circuit according to the fourth preferred embodiment has two external ports P1 and P2, and an internal port P5, as shown in the equivalent circuit of FIG. 21. In this case, a parallel circuit of an inductor L11 implemented by the series-connection type inductor device according to the modified preferred embodiment of the first preferred embodiment of FIGS. 7 and 8 and a capacitor C11 of the series-connection type capacitor device implemented by the two interconnecting conductor films 4*a* and 11*a* sandwiching the dielectric support film 3 therebetween is connected between the port P1 and the port P5. Also, a parallel circuit of an inductor L12 implemented by the series-connection type inductor device according to the modified preferred embodiment of the first preferred embodiment of FIGS. 7 and 8 and a capacitor C12 of the series-connection type capacitor device implemented by the two interconnecting conductor films 4*b* and 11*b* sandwiching the dielectric support film 3 therebetween is connected between the port P2 and the port P5. Further, a capacitor C13 implemented by the grounding type capacitor device according to the modified preferred embodiment of the second preferred embodiment of FIGS. 13 and 14 is connected between the port P5 and the grounding conductor films 2 and 2*a*.

Referring to FIGS. 19 and 20, the recessed portion 1*a* is formed in the silicon substrate 1, and grounding conductor films 2, 2*a*, 2*j* and 2*k* are formed on the surface of the silicon substrate 1 including the recessed portion 1*a*, the protruding portion 1*b* and the side surface of the protruding portion 1*b* and excluding portions 1*c* located just under the interconnecting conductor films 4*f* and 4*g* for use as center conductor of the respective ports P1 and P2, respectively. On the other hand, on the surface of the dielectric support film 3 is formed interconnecting conductor films 4*a* and 4*b* for use as upper electrode, interconnecting conductor films 4*f* and 4*g* for use as center conductor of the ports P1 and P2, an interconnecting conductor film 4*c* of the port P5, strip conductors 4*h* and 4*i* each for connection use, and interconnecting conductor films 4*d* and 4*e* each for use as strip conductor for inductor. In this case, the interconnecting conductor film 4*f* is connected with the interconnecting conductor film 4*a* via the interconnecting conductor film 4*h*, and the interconnecting conductor film 4*a* is connected with the interconnecting conductor film 4*c* via the interconnecting conductor film 4*d* and its one end 4*da*. Further, the interconnecting conductor film 4*c* is connected with the interconnecting conductor film 4*b* via one end 4*ea* of the interconnecting conductor film 4*e* and the interconnecting conductor film 4*e*, while the interconnecting conductor film 4*b* is connected with the interconnecting conductor film 4*g* via the interconnecting conductor films 4*i*.

A through hole 9*a* is formed so as to pass through the dielectric support film 3 in its thickness direction at the one end 4*da* of the interconnecting conductor film 4, and a through hole conductor 9*ac* is filled in the through hole 9*a*. On the other hand, an interconnecting conductor film 11*c* is formed which is connected with the interconnecting conductor film 11*a* for use as lower electrode, at a position on the bottom surface of the dielectric support film 3 where the one end 4*da* of the interconnecting conductor film 4*d* is located. Therefore, the one end 4*da* of the interconnecting conductor film 4*d* is connected with the interconnecting conductor film 11*a* for use as lower electrode via the through hole conductor 9*ac* and the interconnecting conductor film 11*c*. Also, a through hole 9*b* is formed so as to pass through the dielectric support film 3 in its thickness direction, at the one end 4*ea* of the interconnecting conductor film 4*e*, and a through hole conductor 9*bc* is filled in the through hole 9*b*. On the other hand, an interconnecting conductor film 11*d* is formed which is connected with the interconnecting conductor film 11*b* for use as lower electrode, at a position on the bottom surface of the dielectric support film 3 where the one end 4*ea* of the interconnecting conductor film 4*e* is located. Therefore, the one end 4*ea* of the interconnecting conductor film 4*e* is connected with the interconnecting conductor film 11*b* for use as lower electrode via the through hole conductor 9*bc* and the interconnecting conductor film 11*d*.

The port P1 includes an interconnecting conductor film 4*f* for use as center conductor and two interconnecting conductor films 6*a* and 6*b* for use as grounding conductor, and the port P1 is constituted as a G/S/G pad (Ground/Signal/Ground Pad). The interconnecting conductor film 6*a* for use as grounding conductor is connected with the grounding conductor film 2*j* on the silicon substrate 1 via a through hole conductor 7*ac* formed within a through hole 7*a* which is formed so as to pass through the dielectric support film 3 in its thickness direction, and then, the interconnecting conductor film 6*a* is grounded. Also, the interconnecting conductor film 6*b* for use as grounding conductor is connected with the grounding conductor film 2*k* on the silicon substrate 1 via a through hole conductor 7*bc* formed within a through hole 7*b* which is formed so as to pass through the dielectric support film 3 in its thickness direction, and then, the interconnecting conductor film 6*b* is grounded.

The port P2 includes an interconnecting conductor film 4*g* for use as center conductor and two interconnecting conductor films 6*c* and 6*d* each for use as grounding conductor, and the port P2 is constituted as a G/S/G pad (Ground/Signal/Ground Pad). The interconnecting conductor film 6*c* for use as grounding conductor is connected with the grounding conductor film 2*j* on the silicon substrate 1 via a through hole conductor 7*cc* formed within a through hole 7*c* which is formed so as to pass through the dielectric support film 3 in its thickness direction, and then, the interconnecting conductor film 6*c* is grounded. Also, the interconnecting conductor film 6*d* for use as grounding conductor is connected with the grounding conductor film 2*k* on the silicon substrate 1 via a through hole conductor 7*dc* formed within a through hole 7*d* which is formed so as to pass through the dielectric support film 3 in its thickness direction, and then, the interconnecting conductor film 6*d* is grounded.

The dielectric support film 3 is sandwiched between the interconnecting conductor film 4*a* for use as upper electrode and the grounding conductor film 11*a* for use as lower electrode formed on the bottom surface, of the dielectric support film 3, and then, they constitute the capacitor C11. Also, the dielectric support film 3 is sandwiched between the interconnecting conductor film 4*b* for use as upper electrode and the grounding conductor film 11*b* for use as lower electrode formed on the bottom surface of the dielectric support film 3, and they constitute the capacitor C12. Further, the dielectric support film 3 is sandwiched between the interconnecting conductor film 4*c* for use as upper electrode and the grounding conductor film 2*a* for use as lower electrode formed on the top surface of the protruding portion 1*b*, and they constitute the capacitor C13.

On the dielectric support film 3, the interconnecting conductor film 4*d* of a strip conductor is formed so as to connect the interconnecting conductor films 4*a* and 4*c* each for use as upper electrode with each other, and the interconnecting conductor film 4*d* constitutes the inductor L11. Also, on the dielectric support film 3, the interconnecting conductor film 4*e* of a strip conductor is formed so as to connect the interconnecting conductor films 4*b* and 4*c* each for use as upper electrode with each other, and the interconnecting conductor film 4*e* constitutes the inductor L12.

In addition to the above-mentioned arrangement, in the left-side central portion of the dielectric support film 3 shown in FIG. 19, where the interconnecting conductor film is not formed, a plurality of opening portions 8 provided for the purpose of removing the resist material of the resist sacrificial layer filled in the recessed portion 1*a* are formed so as to pass through the dielectric support film 3 in its thickness direction.

FIGS. 22A to 22D, 23A to 23D and 24A to 24D are longitudinal sectional views showing a manufacturing process for manufacturing the low-pass filter circuit of FIG. 19. With reference to these FIGS. 22A to 22D, 23A to 23D and 24A to 24D, the manufacturing process for manufacturing the low-pass filter circuit of FIGS. 19 and 20 will be explained below.

Figure 22A:
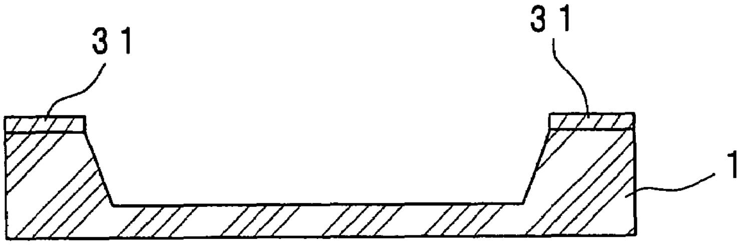
FIG. 22A is a longitudinal sectional view showing a first step of a manufacturing process of the low-pass filter circuit of FIG. 19.
Figure 22B:
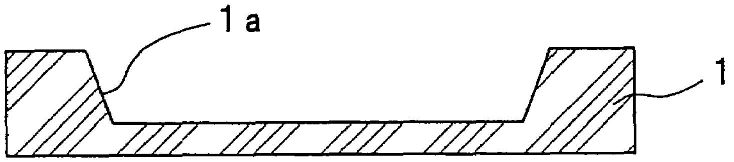
FIG. 22B is a longitudinal sectional view showing a second step of the manufacturing process of the low-pass filter circuit of FIG. 19.
Figure 22C:
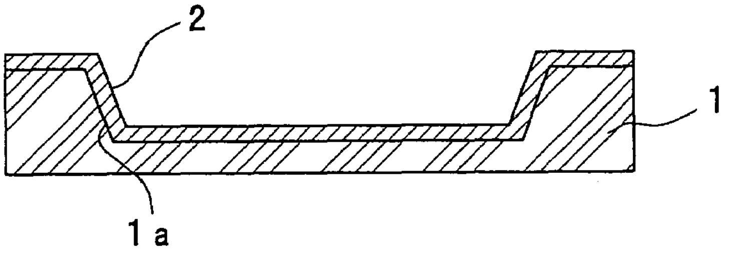
FIG. 22C is a longitudinal sectional view showing a third step of the manufacturing process of the low-pass filter circuit of FIG. 19.
Figure 22D:
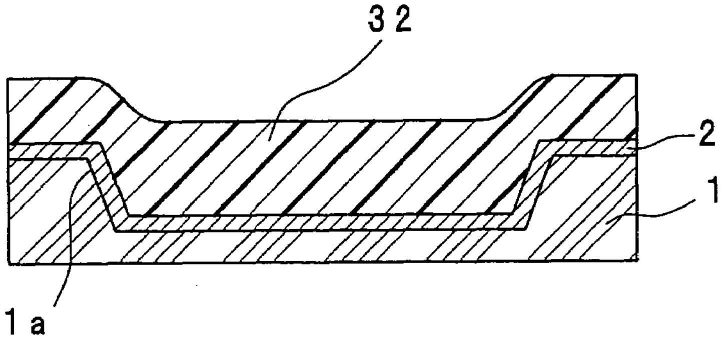
FIG. 22D is a longitudinal sectional view showing a fourth step of the manufacturing process of the low-pass filter circuit of FIG. 19.

First of all, as shown in FIG. 22A, a mask pattern layer 31 made of silicon oxide and having a predetermined pattern is formed on the surface of the silicon substrate 1 by using the thermal oxidation process and the photolithography. Next, as shown in FIG. 22B, the surface of the silicon substrate 1 is etched by the so-called micromachining technique with an alkaline aqueous solution made of, for example, KOH, so that the recessed portion 1*a* having a predetermined depth is formed. The depth, to which the silicon substrate is to be etched, is determined based on a Q value required for the inductor device, and it is preferably 30 μm as an example. Then, as shown in FIG. 22C, the grounding conductor film 2 made of Au is formed by the sputtering process or the like on the recessed portion 1*a* of the silicon substrate 1 so as to extend from the recessed portion 1*a* onto the surface of the silicon substrate 1. Further, as shown in FIG. 22D, the unnecessary portions (portions 1*c* of FIG. 19) of the grounding conductor film 2 are removed by the photolithography and the ion beam etching process. Also, the resist sacrificial layer 32 is formed by coating the resist material of the resist sacrificial layer 32 on the surface of the silicon substrate 1, its recessed portion 1*a* and the grounding conductor film 2, so that the interior of the recessed portion 1*a* is filled with the resist sacrificial layer 32.

Figure 23A:
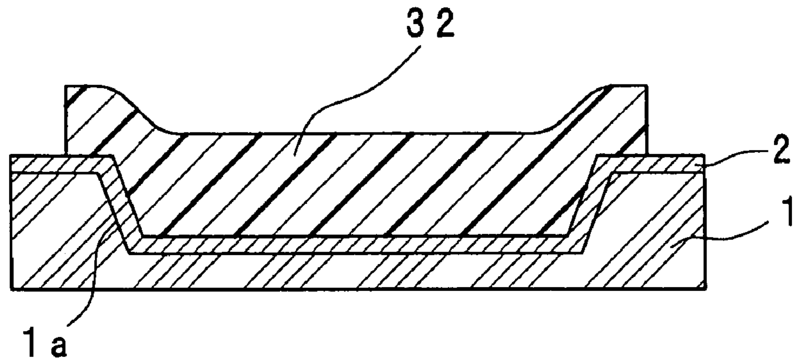
FIG. 23A is a longitudinal sectional view showing a fifth step of the manufacturing process of the low-pass filter circuit of FIG. 19.
Figure 23B:
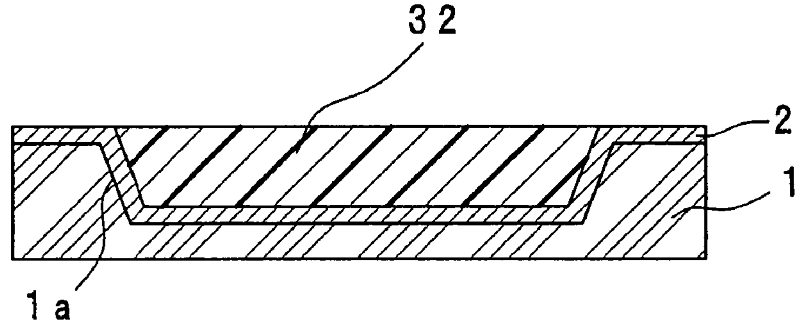
FIG. 23B is a longitudinal sectional view showing a sixth step of the manufacturing process of the low-pass filter circuit of FIG. 19.
Figure 23C:
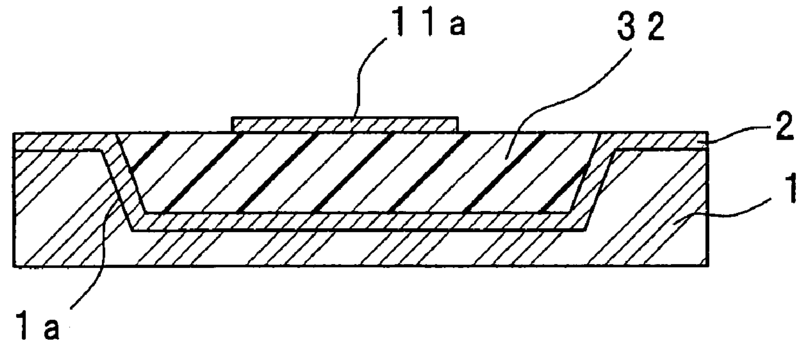
FIG. 23C is a longitudinal sectional view showing a seventh step of the manufacturing process of the low-pass filter circuit of FIG. 19.
Figure 23D:
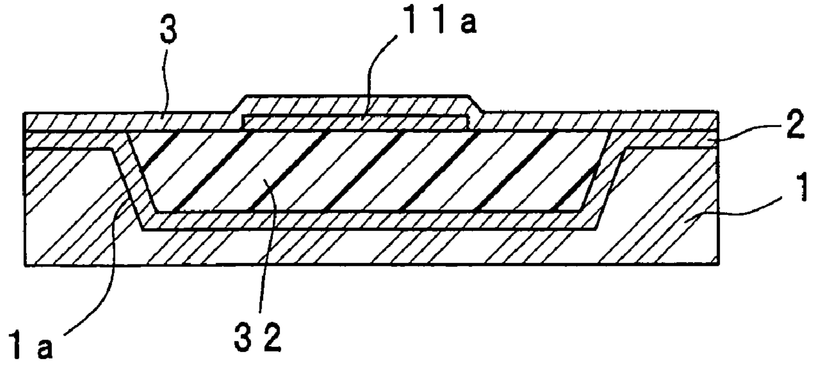
FIG. 23D is a longitudinal sectional view showing an eighth step of the manufacturing process of the low-pass filter circuit of FIG. 19.

Then, as shown in FIG. 23A, the resist sacrificial layer 32 is partially etched by using the photolithography so that its pattern portion larger than the recessed portion 1*a* remains, with the other pattern portions removed. As shown in FIG. 23B, on the silicon substrate 1 having the grounding conductor film 2 and the resist sacrificial layer 32 formed thereon, the top surface of the resist sacrificial layer 32 is polished so as to become substantially the same horizontal surface as that of the grounding conductor film 2 by the CMP process, and this leads to planarization of the resist sacrificial layer 32 and the grounding conductor film 2. Further, as shown in FIG. 23C, on the polished surface, an interconnecting conductor film 11*a* (including interconnecting conductor films 11*b*, 11*c* and 11*d* in FIG. 19) to be formed on the bottom surface of the dielectric support film 3 is formed, and thereafter, as shown in FIG. 23D, the dielectric support film 3 is formed on the top surface of the high frequency apparatus by the sputtering process or the like.

Figure 24A:
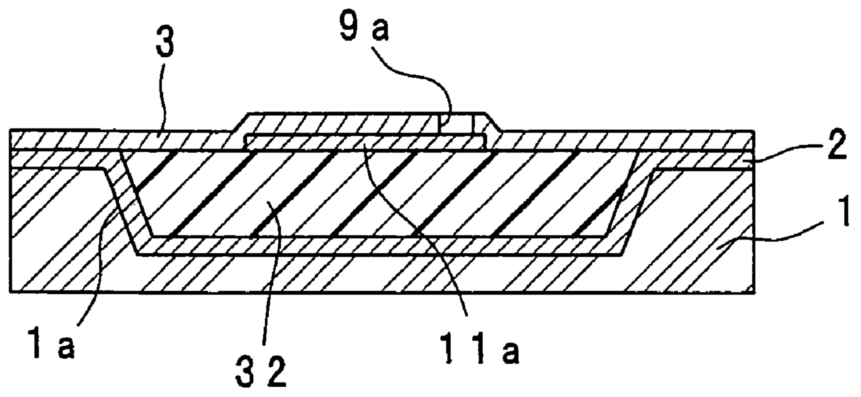
FIG. 24A is a longitudinal sectional view showing a ninth step of the manufacturing process of the low-pass filter circuit of FIG. 19.
Figure 24B:
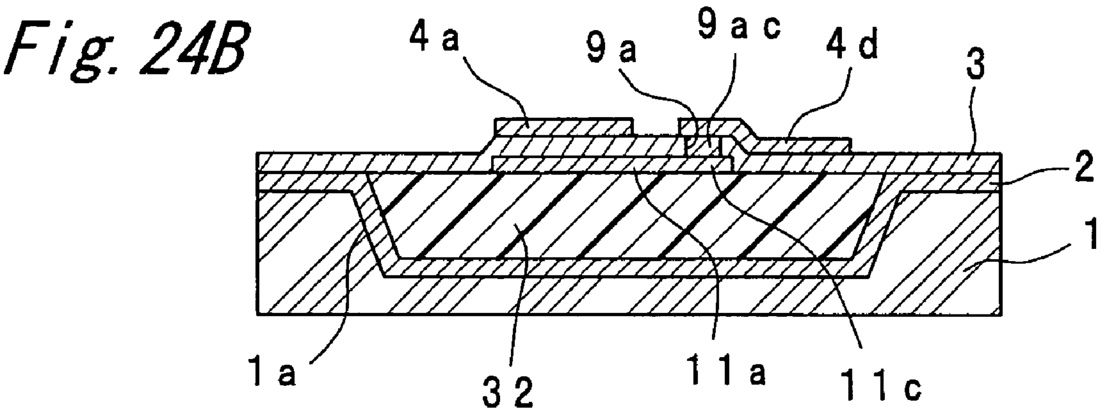
FIG. 24B is a longitudinal sectional view showing a tenth step of the manufacturing process of the low-pass filter circuit of FIG. 19.
Figure 24C:
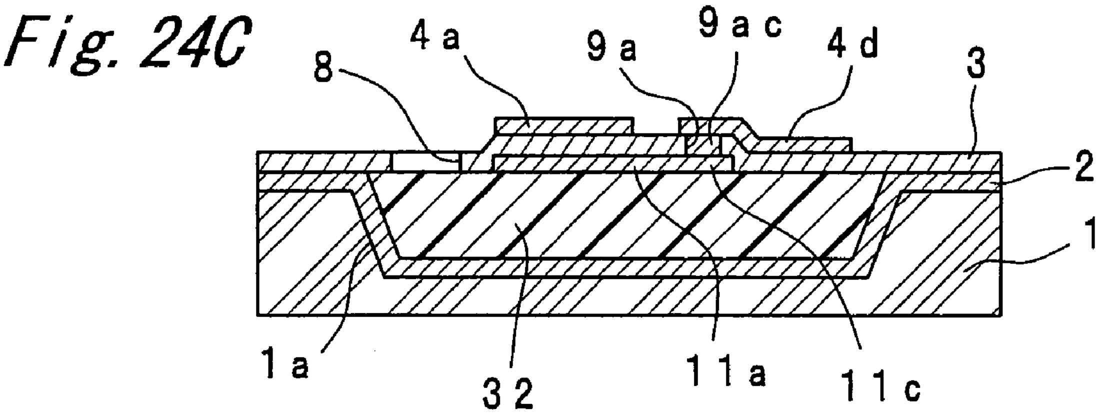
FIG. 24C is a longitudinal sectional view showing an eleventh step of the manufacturing process of the low-pass filter circuit of FIG. 19.
Figure 24D:
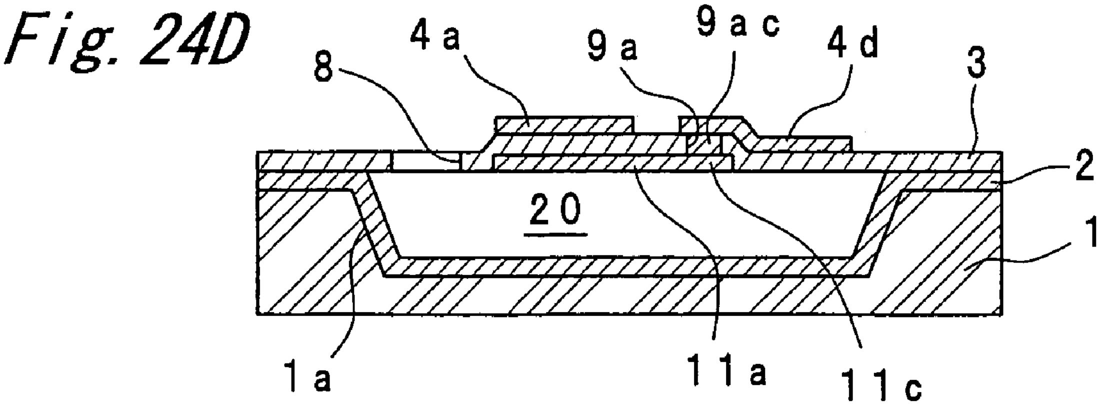
FIG. 24D is a longitudinal sectional view showing a twelfth step of the manufacturing process of the low-pass filter circuit of FIG. 19.
Figure 25:
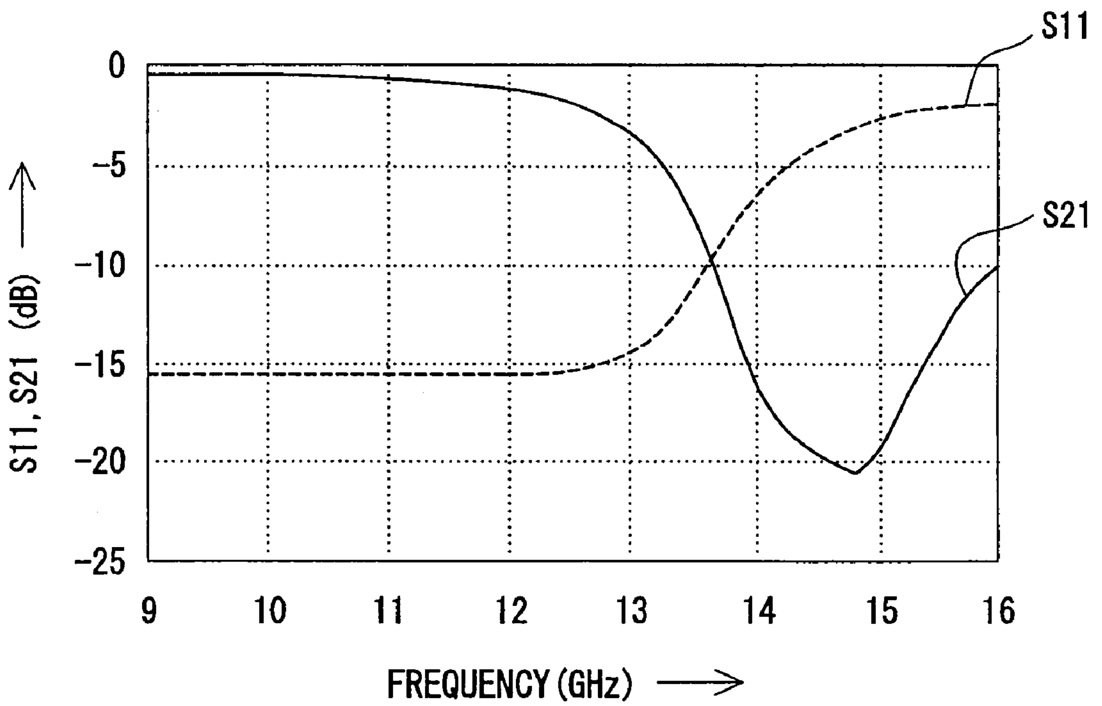
FIG. 25 is a graph of experimental results of the low-pass filter circuit of FIG. 19, showing frequency characteristics of a pass coefficient S21 and a reflection coefficient S11 of the low-pass filter circuit.

Subsequently, as shown in FIG. 24A, a through hole 9*a* (including a through hole 9*b* of FIG. 19) is formed so as to pass through the dielectric support film 3 in its thickness direction by the photolithography and the reactive ion etching process. Then, as shown in FIG. 24B, the interconnecting conductor films 4*a* and the like made of Au are formed on the dielectric support film 3 by the sputtering process or the like, and then, they are etched with a predetermined pattern by the photolithography and the ion beam etching process, so that the interconnecting conductor film 4 becomes predetermined interconnecting conductor films 4*a* and 4*d* (further including the interconnecting conductor films 4*f*, 4*h*, 4*c*, 4*e*, 4*b*, 4*i*, 4*g*, 6*a*, 6*b*, 6*c*, 6*d*, etc. of FIG. 19). In this process, for example, the material of the interconnecting conductor film 4*d* is filled as a through hole conductor 9*ac* into the through hole 9*a*, and then, the one end 4*da* of the interconnecting conductor film 4*d* is connected with the interconnecting conductor film 11*c* via the through hole conductor 9*ac*. Then, as shown in FIG. 24C, at a plurality of portions of the dielectric support film 3 which are just above the resist sacrificial layer 32 and where the interconnecting conductor film 4*a* or the like is not formed, a plurality of rectangular-shaped opening portions 8 are formed so as to pass through the dielectric support film 3 in its thickness direction by the photolithography and the reactive ion etching process. Further, as shown in FIG. 24D, the resist sacrificial layer 32 is etched via the opening portions 8 by the wet etching process, so that the resist sacrificial layer 32 is removed. Thus, the low-pass filter circuit can be manufactured. As apparent from FIG. 25, it can be understood that the low-pass filter circuit of FIG. 19 allows high frequency signals of around 12 GHz or lower to pass therethrough, and does not allow high frequency signals of frequency bands higher than 12 GHz to pass therethrough. For instance, it can be understood that, in a case where the reception band is around 12 GHz and the transmission band is around 14 GHz, this low-pass filter circuit operates as a filter circuit for the reception band.

In the low-pass filter circuit as constituted as shown above, since one silicon substrate 1 alone is used, the device structure is quite simple and the manufacturing process is simple, as compared with the above-mentioned first and second prior arts, thus making it possible to remarkably reduce the manufacturing cost. Also, at high frequency bands such as 12 GHz, such low-loss frequency characteristics as described above could not be obtained with the high frequency circuit of prior art in which the low-pass filter circuit is formed directly on the silicon substrate without using any membrane structure, however, extremely low loss characteristics can be obtained with the membrane structure according to the present preferred embodiment in which an air space is provided under the bottom surface of the dielectric support film 3.

Fifth Preferred Embodiment

Figure 26:
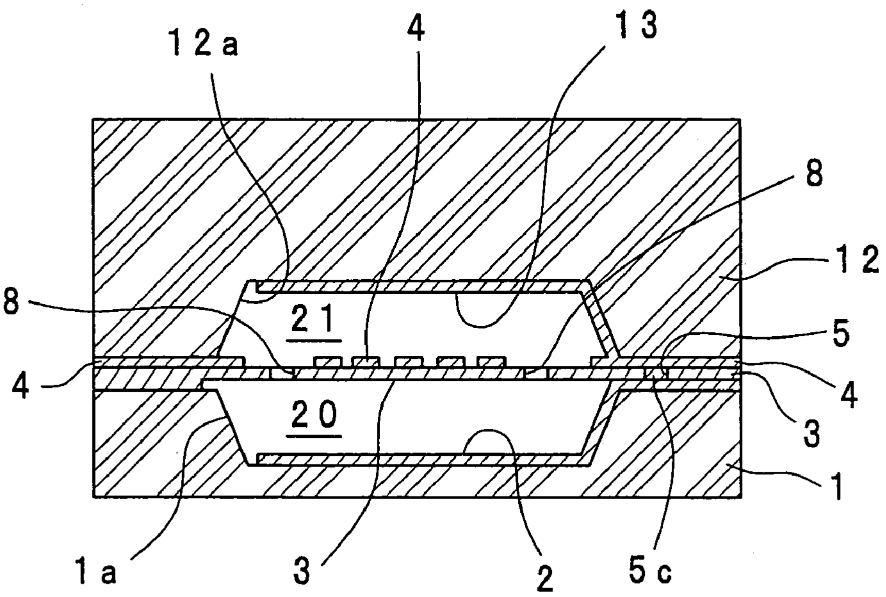
FIG. 26 is a longitudinal sectional view showing a structure of a grounding type inductor device of a fifth preferred embodiment of the present invention.

FIG. 26 is a longitudinal sectional view showing a structure of a grounding type inductor device of a fifth preferred embodiment according to the present invention. The grounding type inductor device according to this fifth preferred embodiment is characterized in that, as shown in FIG. 26, a cap type silicon substrate 12 as described below is stacked and bonded on top of the completed grounding type inductor device of FIG. 2, so that the recessed portion 1*a* opposes a recessed portion 12*a*, as compared with the grounding type inductor device according to the first preferred embodiment of FIG. 2.

More specifically, a recessed portion 12*a* having a depth equal to that of the recessed portion 1*a* is formed on the silicon substrate 12 by using the manufacturing steps depicted in FIGS. 3A to 3D, and thereafter, a grounding conductor film 13 is formed on the surface of the recessed portion 12*a*. Then, after the cap type silicon substrate 12 is inverted up and down, the up-and-down inverted silicon substrate 12 is stacked and bonded on the top surface of the completed grounding type capacitor device of FIG. 2, so that the two recessed portions 1*a* and 12*a* confront each other. In this state, in the silicon substrate 1, an air space 20 is formed between the dielectric support film 3 and the grounding conductor film 2 of the recessed portion 1*a* as described above. On the other hand, in the silicon substrate 12, an air space 21 is formed between the dielectric support film 3 and the grounding conductor film 13 of the recessed portion 12*a*. It is noted that the grounding conductor film 13 and the grounding conductor film 5 are connected with each other, and they are grounded.

In the grounding type inductor device constituted as described above having the above-described membrane structure, referring to FIG. 26, a microstrip line is constituted by the dielectric support film 3 and the interconnecting conductor film 4, between which the air space 20 is sandwiched, as well as by the two grounding conductor films 2 and 13. Thus, when a high frequency signal is inputted to the microstrip line, the high frequency signal is propagated along the longitudinal direction of the interconnecting conductor film 4, so that an electromagnetic field of the high frequency signal is substantially generated between the interconnecting conductor film 4 and the grounding conductor film 2 via the dielectric support film 3 and the air space 20, as well as between the interconnecting conductor film 4 and the grounding conductor film 13 via the air space 21. However, the dielectric support film 3 is extremely thin and the electromagnetic field is generated mostly in the air spaces 20 and 21, so that the transmission loss can be remarkably reduced, as compared with the microstrip line of the prior art employing the dielectric substrates. Also, since the high frequency circuit of the grounding type inductor device is sandwiched by the two grounding conductor films 2 and 13, and moreover, the grounding type inductor device is substantially surrounded by the two grounding conductor films 2 and 13, then the device can be shielded from the electromagnetic field of noise or the like from the outside thereof. Furthermore, since only two silicon substrates 1 and 12 are used in this fifth preferred embodiment, the device structure is quite simple, and the manufacturing process is simple, as compared with the prior art device employing three or more substrates, thus obtaining such a unique advantageous effect that the manufacturing cost can be remarkably reduced.

The cap type silicon substrate 12 according to the fifth preferred embodiment as described above is applicable not only to the first preferred embodiment but also widely to the other preferred embodiments.

Sixth Preferred Embodiment

Figure 27:
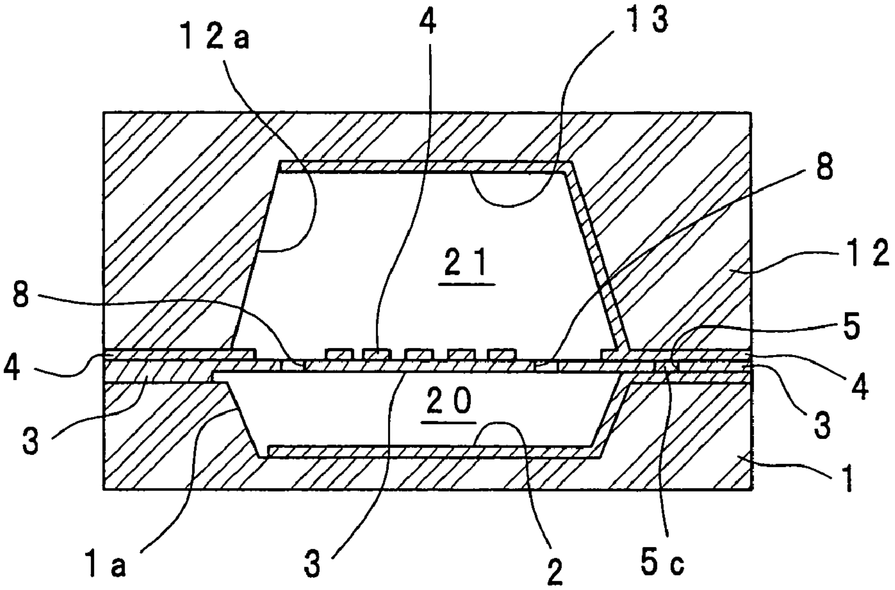
FIG. 27 is a longitudinal sectional view showing a structure of a grounding type inductor device of a sixth preferred embodiment of the present invention.

FIG. 27 is a longitudinal sectional view showing a structure of a grounding type inductor device of a sixth preferred embodiment according to the present invention. The grounding type inductor device according to this sixth preferred embodiment is characterized in that, as shown in FIG. 27, the depth of the recessed portion 12*a* to be formed in the silicon substrate 12 is set to such a sufficient depth that substantially no electromagnetic field is generated between the interconnecting conductor film 4 and the grounding conductor film 13, as compared with the fifth preferred embodiment of FIG. 26.

In the grounding type inductor device constituted as described above, since the electromagnetic field generated when a high frequency signal is inputted to the inductor device is located only between the interconnecting conductor film 4 and the grounding conductor film 2 only via the air space 20, the transmission loss can be remarkably reduced, as compared with that of the fifth preferred embodiment. Also, since the high frequency circuit of the grounding type inductor device is sandwiched by the two grounding conductor films 2 and 13, and moreover, the grounding type inductor device is substantially surrounded by the two grounding conductor films 2 and 13, the inductor device can be shielded from the electromagnetic field of noise or the like from the outside thereof. Furthermore, since only two silicon substrates 1 and 12 are used in the present sixth preferred embodiment, the device structure is quite simple and the manufacturing process is simple, as compared with a high frequency device of a prior art employing three or more substrates, thus obtaining such a unique advantageous effect that the manufacturing cost can be remarkably reduced.

The cap type silicon substrate 12 according to the sixth preferred embodiment as described above is applicable not only to the first preferred embodiment but also widely to the other preferred embodiments.

Seventh Preferred Embodiment

Figure 28:
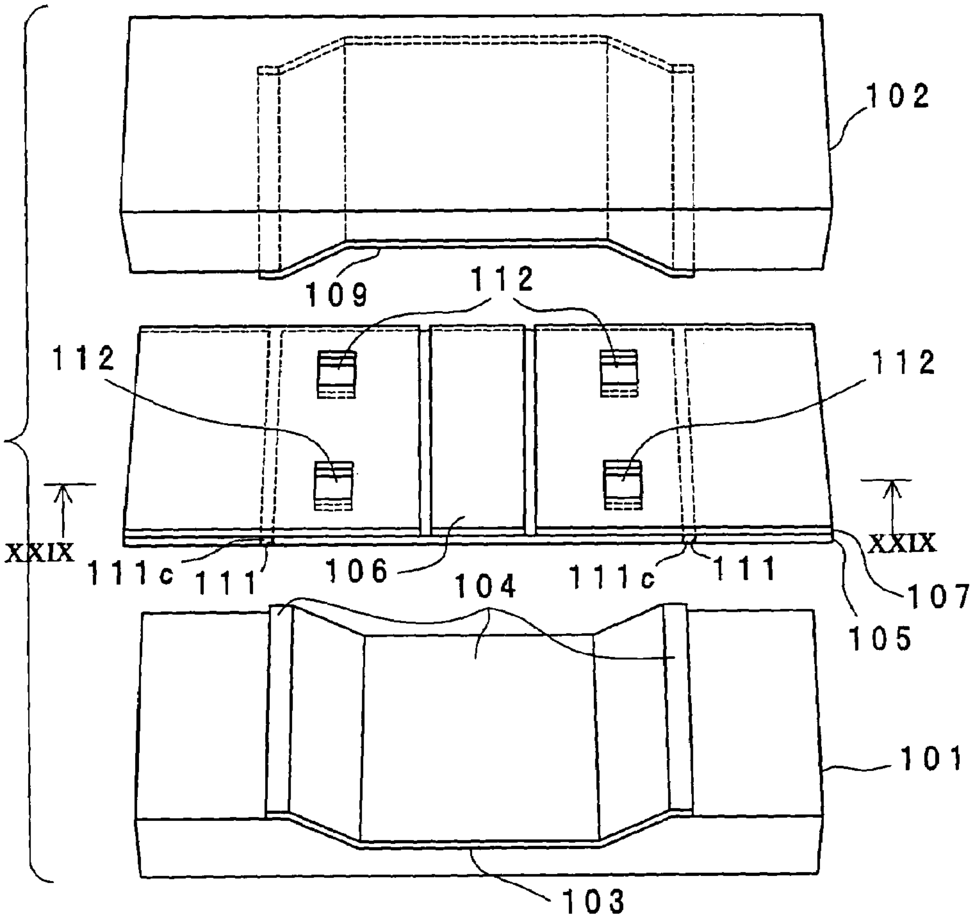
FIG. 28 is an exploded perspective view showing a structure of a grounded coplanar line of a seventh preferred embodiment according to the present invention.
Figure 29:
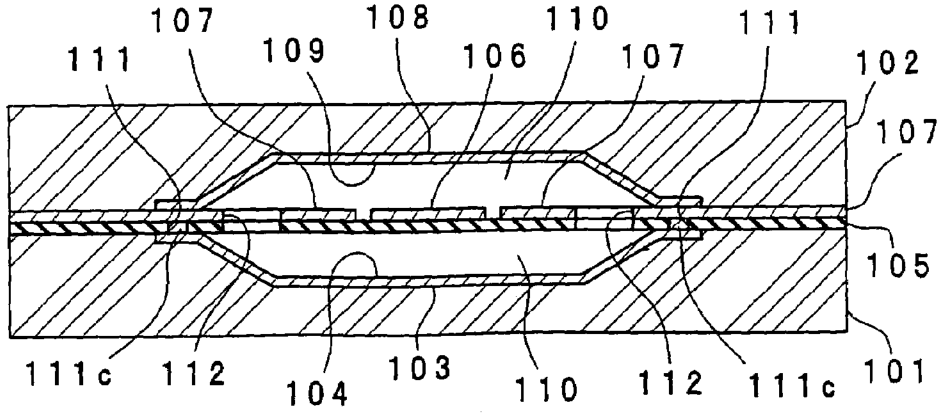
FIG. 29 is a longitudinal sectional view showing a cross section taken along the line XXIX-XXIX of FIG. 28.

FIG. 28 is an exploded perspective view showing a structure of a grounded coplanar line of a seventh preferred embodiment according to the present invention, and FIG. 29 is a longitudinal sectional view showing a cross section taken along the line XXIX-XXIX of FIG. 28. The grounded coplanar line according to the seventh preferred embodiment has, as shown in FIGS. 28 and 29, a grounding conductor film 104 at a recessed portion 103 of a silicon substrate 101, an interconnecting conductor film 106 for transmission use, two grounding conductor films 107 on a dielectric support film 105, and a grounding conductor film 109 at a recessed portion 108 of a silicon substrate 102.

Referring to FIGS. 28 and 29, a recessed portion 103 having a predetermined depth is formed on a surface of a silicon substrate 101. A grounding conductor film 104 is formed on the recessed portion 103 and a part of the silicon substrate 101. The grounding conductor film 104 is formed on the whole surface of the recessed portion 103 and further so as to extend up to a part of the silicon substrate 101 via the slope surface of the recessed portion 103. A dielectric support film 105 is formed on the silicon substrate 101 on which the grounding conductor film 104 is formed. An interconnecting conductor film 106 for transmission use of a strip conductor is formed at the center of the surface of the dielectric support film 105 on one side on which the dielectric support film 105 is to be bonded with the silicon substrate 102, and a pair of grounding conductor films 107 are formed on both the sides in the width direction of the interconnecting conductor film 106 for transmission use, with a spacing between the interconnecting conductor film 106 and one of the grounding conductors 107, and with another spacing between the interconnecting conductor film 106 and another one of the grounding conductors 107. In this case, the spacing between the interconnecting conductor film 106 for transmission use and each of the grounding conductor films 107 is set to such a small or fine distance that the electromagnetic field is generated between the interconnecting conductor film 106 for transmission use and each of the grounding conductor films 107 when a high frequency signal is inputted to the coplanar line. Further, the width of each grounding conductor film 107 is so set to be enough wide, as compared with the width of the interconnecting conductor film 106 for transmission use.

Also, in the dielectric support film 105, a plurality of opening portions 112 provided for the purpose of etching of a later-described resist sacrificial layer 114 are formed so as to pass through the grounding conductor films 107 and the dielectric support film 105 in their thickness direction. Further, through holes 111 are formed so as to pass through the dielectric support film 105 in its thickness direction at both side portions located outside of air spaces 110, which the grounding conductor film 104 and the grounding conductor film 109 oppose each other in close contact with the dielectric support film 105 interposed therebetween, and a through hole conductors 111*c* of the same material as that of the grounding conductor films 107 are filled in the through holes 111.

On the other hand, a recessed portion 108 having a depth similar to that of the silicon substrate 101 is formed in the silicon substrate 102, and a grounding conductor film 109 is formed on the recessed portion 108 and a part of the silicon substrate 102. The grounding conductor film 109 is formed on the whole surface of the recessed portion 108, and is formed so as to extend to a part of the silicon substrate 102 via the slope surface of the recessed portion 108.

Referring to FIG. 29, the silicon substrate 101, the dielectric support film 105 and the silicon substrate 102 are bonded together so that the recessed portion 103 and the recessed portion 108 oppose each other, and that the dielectric support film 105 is sandwiched by the silicon substrate 101 and the silicon substrate 102. Then this leads to obtaining of constitution of a grounded coplanar line according to this seventh preferred embodiment. In this case, a space of the recessed portion 103 of FIG. 29 is constituted as an air space 110, and a space of the recessed portion 108 is constituted as another air space 110. In the grounded coplanar line constituted as shown above, the grounding conductor film 104, the grounding conductor films 107 and the grounding conductor film 109 are electrically connected via the through hole conductor 111*c*, so that the interconnecting conductor film 106 for transmission use is surrounded by these grounding conductor films 104, 107 and 109.

In the grounded coplanar line according to the seventh preferred embodiment constituted as shown above, when the electric potentials of the grounding conductor film 104, the grounding conductor films 107 and the grounding conductor film 109 are held at ground voltage (0 V), the high frequency signal can be propagated and transmitted along the longitudinal direction of the interconnecting conductor film 106 for transmission use. In this case, if the distance between the interconnecting conductor film 106 for transmission use and each of the grounding conductor films 107 is enough smaller than the wavelength of the transmitting high frequency signal, then the electromagnetic wave generated within the cross section shown in FIG. 29 becomes a TEM wave. In this case, most of the electromagnetic field energy is distributed to the air regions between the interconnecting conductor film 106 for transmission use and each of the grounding conductor films 107 as well as to the parts of the air spaces 110 of air layers provided above and below the interconnecting conductor film 106 for transmission use, and therefore, the dielectric loss (or transmission loss) associated with the dielectric can be remarkably reduced, as compared with a transmission line of a prior art employing a dielectric substrate.

In the above-mentioned preferred embodiment, the silicon substrates 101 and 102 are fundamentally used in terms of easiness of processing or the like. However, the present invention is not limited to this, and the other semiconductor substrates, glass substrates or the other dielectric substrates may be also used.

FIGS. 30A to 30E, 31A to 31D, 32A to 32D and 33 are longitudinal sectional views showing a manufacturing process for manufacturing the grounded coplanar line of FIGS. 28 and 29. With reference to these figures, the manufacturing method for this grounded coplanar line will be described below.

Figure 30A:
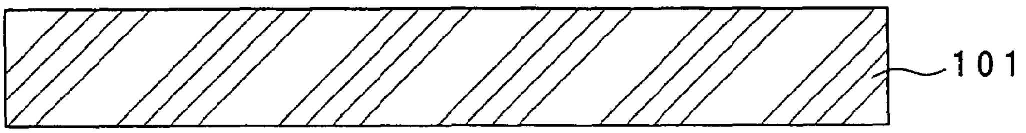
FIG. 30A is a longitudinal sectional view showing a first step of a manufacturing process of the grounded coplanar line of FIG. 28.
Figure 30B:
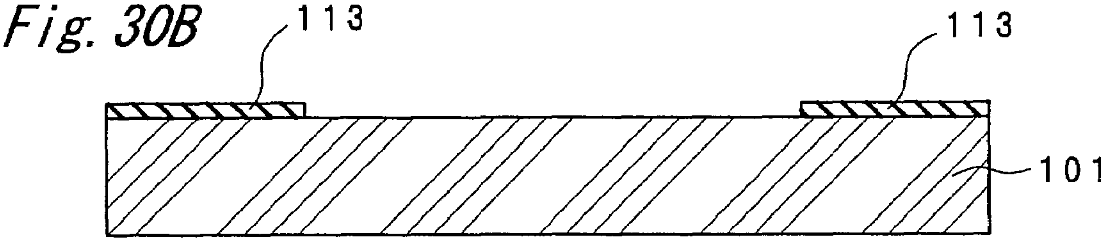
FIG. 30B is a longitudinal sectional view showing a second step of the manufacturing process of the grounded coplanar line of FIG. 28.
Figure 30C:
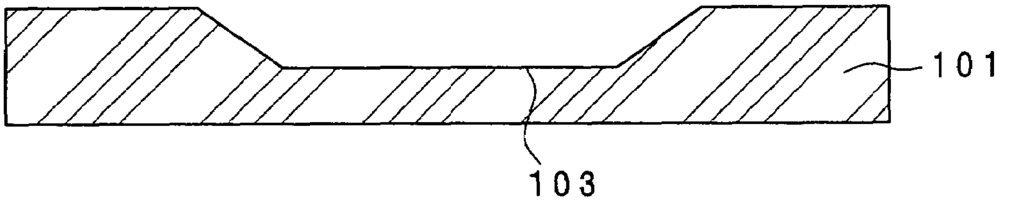
FIG. 30C is a longitudinal sectional view showing a third step of the manufacturing process of the grounded coplanar line of FIG. 28.
Figure 30D:
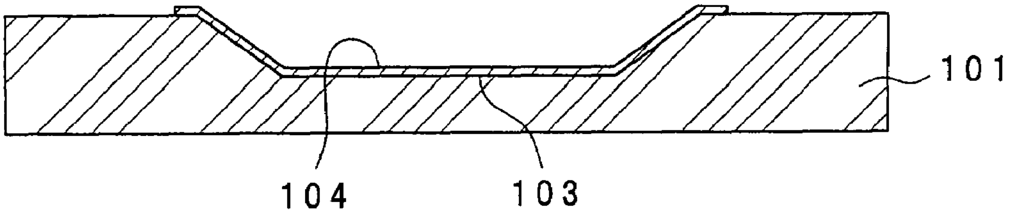
FIG. 30D is a longitudinal sectional view showing a fourth step of the manufacturing process of the grounded coplanar line of FIG. 28.
Figure 30E:
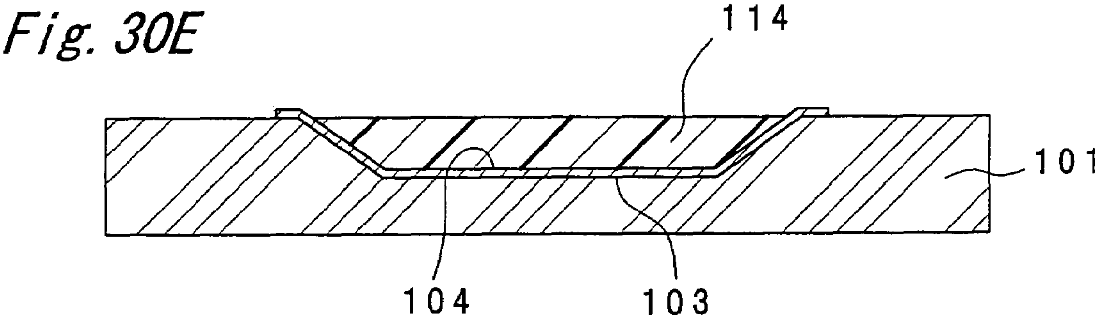
FIG. 30E is a longitudinal sectional view showing a fifth step of the manufacturing process of the grounded coplanar line of FIG. 28.

First of all, the manufacturing process for manufacturing a structural body of the silicon substrate 101 and the dielectric support film 105 will be explained with reference to FIGS. 30A to 30E and 31A to 31D. First, as shown in FIG. 30A, the semiconductor substrate 101 having a planarized top surface is formed by using a well known method such as Chokralski method or the like. Then, as shown in FIG. 30B, a mask pattern layer 113 made of resist such as photosensitive resin or $SiO_2$ film is formed on the surface of the silicon substrate 101 by using, for example, the photolithography process or the like. Then, as shown in FIG. 30C, the surface of the silicon substrate 101 is etched to a depth of 6 μm with an alkaline aqueous solution of, for example, KOH, so that a recessed portion 103 having a shape of inverted truncated-pyramid is formed. Further, as shown in FIG. 30D, the grounding conductor film 104 made of Au is formed on the whole surface of the recessed portion 103, and further, is formed so as to extend to a part of the silicon substrate 101 via the slope surface of the recessed portion 103 by the sputtering process and the photolithography. Also, as shown in FIG. 30E, a material of a resist sacrificial layer 114 is filled into the recessed portion 103, and thereafter, the formed resist sacrificial layer 114 is planarized by the CMP process so that an exposed top surface of the resist sacrificial layer 114 becomes substantially the same horizontal surface as the surface onto which the grounding conductor film 104 extends on the surface of the silicon substrate 101.

Figure 31A:
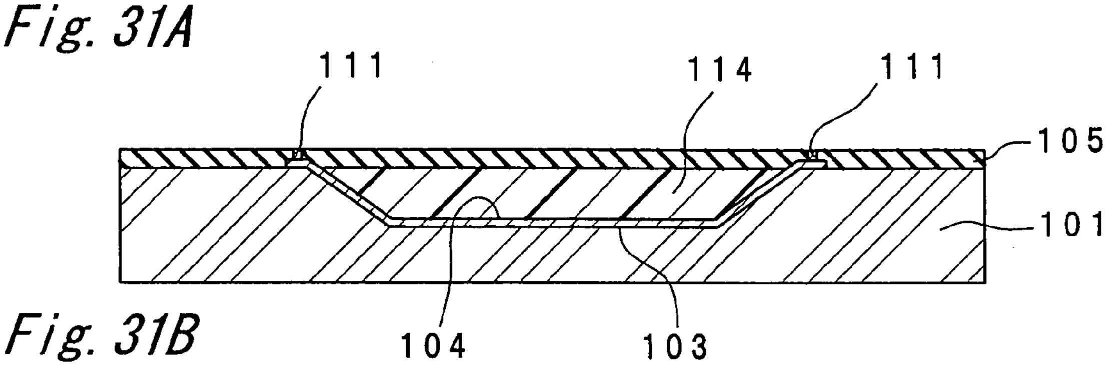
FIG. 31A is a longitudinal sectional view showing a sixth step of the manufacturing process of the grounded coplanar line of FIG. 28.
Figure 31B:
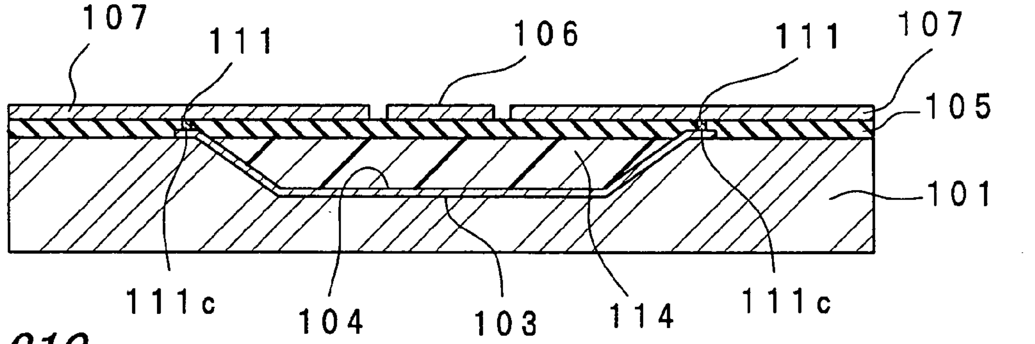
FIG. 31B is a longitudinal sectional view showing a seventh step of the manufacturing process of the grounded coplanar line of FIG. 28.
Figure 31C:
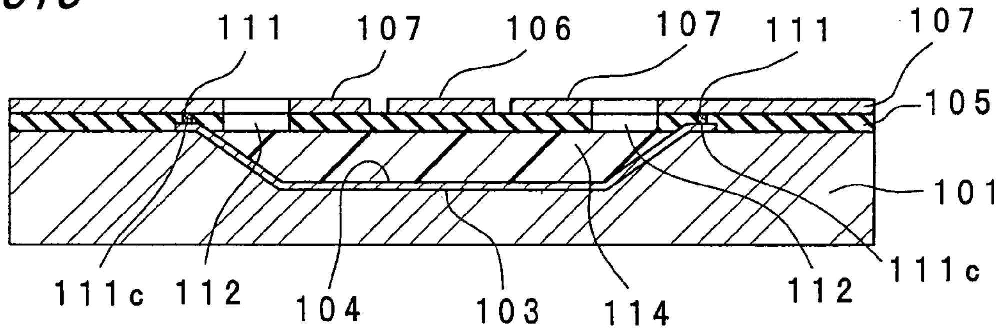
FIG. 31C is a longitudinal sectional view showing an eighth step of the manufacturing process of the grounded coplanar line of FIG. 28.
Figure 31D:
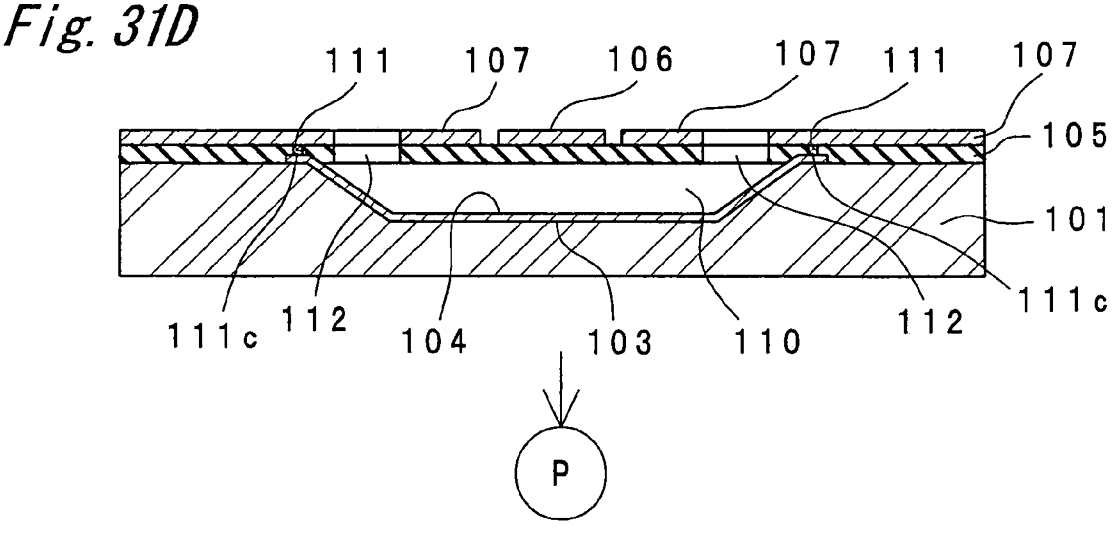
FIG. 31D is a longitudinal sectional view showing a ninth step of the manufacturing process of the grounded coplanar line of FIG. 28.

Subsequently, as shown in FIG. 31A, the dielectric support film 105 made of SixNy ($0<x<3$, $2<y<5$) is formed on the surface of the resist sacrificial layer 114 and on its peripheral surface of the silicon substrate 101. Thereafter, as shown in FIG. 31B, through holes 111 are formed so as to pass through the dielectric support film 3 in its thickness direction at positions on the surface of the silicon substrate 101 where the recessed portion 103 is not formed. Then, as shown in FIG. 31C, a conductor film made of Au is formed on the surface of the dielectric support film 105, and thereafter, the interconnecting conductor film 106 for transmission use of a strip conductor and the grounding conductor films 107 formed on both sides in the width direction of the interconnecting conductor film 106 for transmission use are formed with a predetermined pattern by the photolithography. In this process, at the same time, the material of the conductor film is also filled into the through holes 111, so that through hole conductors 111*c* are formed which connect the grounding conductor film 104 with the grounding conductor films. Also, at a plurality of positions above an air space 110 which are separated sufficiently or appropriately from the interconnecting conductor film 106 for transmission use, a plurality of opening portions 112 are formed by etching the grounding conductor films 107 and the dielectric support film 105 by using the ion beam etching process so as to pass through the grounding conductor films 107 and the dielectric support film 105 in their thickness direction and so as to make the resist sacrificial layer 114 exposed. Further, as shown in FIG. 31D, the resist sacrificial layer 114 is etched via the opening portions 112 by using the wet etching process with acetone so that the resist sacrificial layer 114 is removed substantially completely.

Through the steps as described above, a structural body comprised of the silicon substrate 101 and the dielectric support film 105 has been first formed.

Next, the manufacturing process for manufacturing the silicon substrate 102 will be described below with reference to FIGS. 32A to 32D. FIGS. 32A to 32D show the upside-down silicon substrate 102 because of the arrangement relationship with the silicon substrate 101. However, in the actual manufacturing process, after the process execution with the silicon substrate 102 inverted to be upside-down from that of FIGS. 32A to 32D, the silicon substrate 102 is inverted to be up-and-down immediately before it is bonded to the silicon substrate 101, and then, the silicon substrates 101 and 102 are bonded to each other.

Figure 32A:
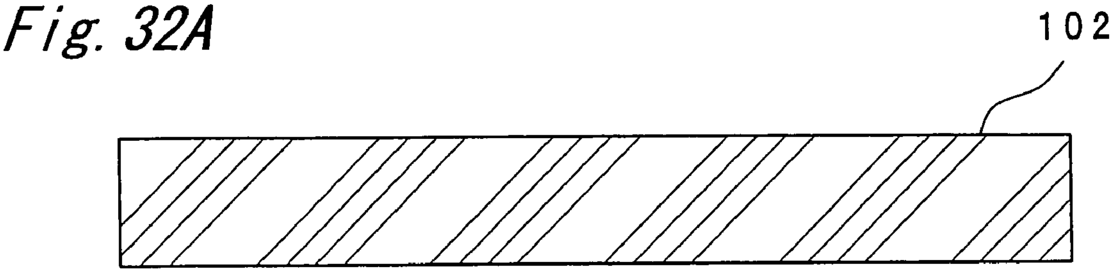
FIG. 32A is a longitudinal sectional view showing a tenth step of the manufacturing process of the grounded coplanar line of FIG. 28.
Figure 32B:
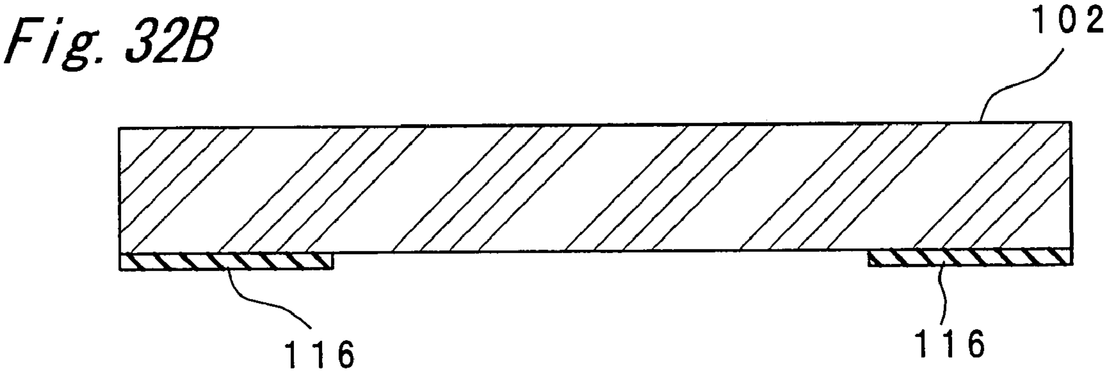
FIG. 32B is a longitudinal sectional view showing an eleventh step of the manufacturing process of the grounded coplanar line of FIG. 28.
Figure 32C:
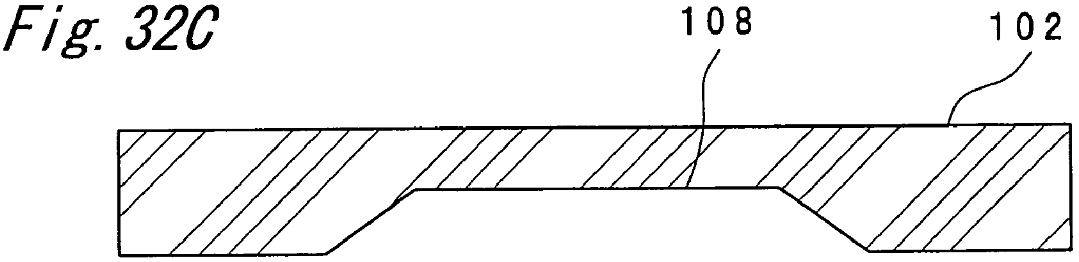
FIG. 32C is a longitudinal sectional view showing a twelfth step of the manufacturing process of the grounded coplanar line of FIG. 28.
Figure 32D:
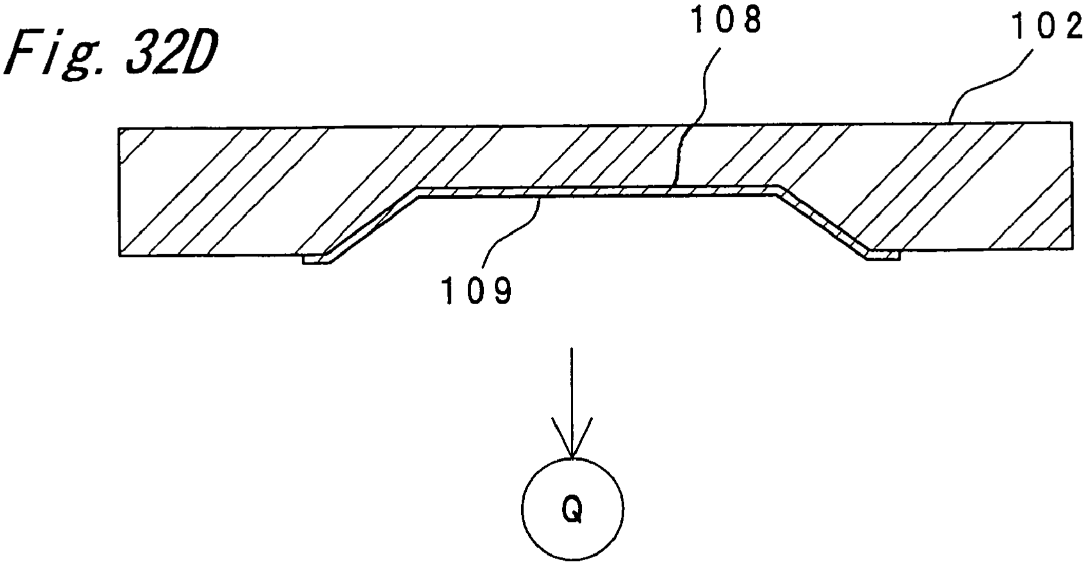
FIG. 32D is a longitudinal sectional view showing a thirteenth step of the manufacturing process of the grounded coplanar line of FIG. 28.

First of all, as shown in FIG. 32A, the silicon substrate 102 is formed in a manner similar to that of the processing step shown in FIG. 30A, and thereafter, a mask pattern layer 116 made of, for example, resist or $SiO_2$ is formed on the silicon substrate 102 by a method similar to that of the processing step of FIG. 30B. Subsequently, as shown in FIG. 32C, the recessed portion 108 is formed in the silicon substrate 102 by using the so-called micromachining technique in a manner similar to that of the processing step of FIG. 30C. Further, as shown in FIG. 32D, the grounding conductor film 109 is formed on the whole surface of the recessed portion 108 and further so as to extend to a part of the silicon substrate 102 in a manner similar to that of the processing step of FIG. 30D.

Figure 33:
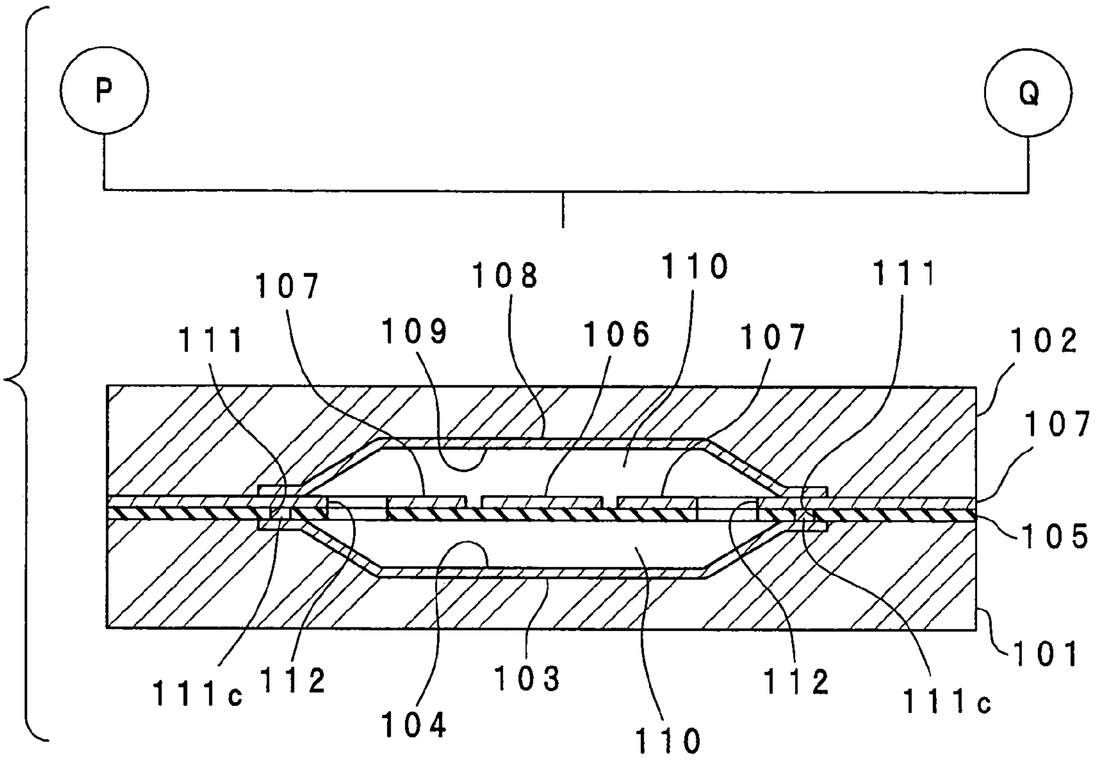
FIG. 33 is a longitudinal sectional view showing a fourteenth step of the manufacturing process of the grounded coplanar line of FIG. 28.

After the structural body comprised of the silicon substrate 101 and the dielectric support film 105, and the silicon substrate 102 are formed in the manner as described above, then the structural body comprised of the silicon substrate 101 and the dielectric support film 105, and the silicon substrate 102 are bonded together so that the recessed portion 103 of the silicon substrate 101 and the recessed portion 108 of the silicon substrate 102 oppose each other, as shown in FIG. 33. Thus, a grounded coplanar line according to this preferred embodiment is completed. It is noted that as the bonding method for the two silicon substrates 101 and 102, a method may be used which is performed by a heat and pressure welding of Au materials between the grounding conductor films 107 and the grounding conductor film 109, or another method may be used which is performed by providing a thermosetting organic adhesive layer between the grounding conductor films 107 and the grounding conductor film 109 to make these films 107 and 109 bonded together.

As described above, according to the grounded coplanar line of the present preferred embodiment, without using any dielectric substrate which has been used in the prior art, an extremely thin dielectric support film 105 is used as a component for forming the interconnecting conductor film 106 for transmission use and the grounding conductor films 107, and a coplanar line is formed on the dielectric support film 105. Therefore, when a high frequency signal is inputted to the coplanar line, an electromagnetic field is generated only in the dielectric support film 105 and at the air space portions (a part of each of the air spaces 110) between the interconnecting conductor film 106 for transmission use and the grounding conductor films 107, so that the dielectric loss or the transmission loss can be remarkably reduced, as compared with that of the prior art. As a result, the transmission efficiency can be improved. Further, the present coplanar line is surrounded by the grounding conductor films 104 and 109, and this leads to shielding from any external electromagnetic field.

Further, the grounded coplanar line having, for example, a characteristic impedance of 50 Ω is constituted by using the dielectric support film 105 and the air spaces 110 of air layers instead of dielectric substrates, and therefore, the thickness between (a) the interconnecting conductor film 106 for transmission use and the grounding conductor films 107, and (b) the grounding conductor films 104 and 109 can be made smaller than that of the prior art, and then, the coplanar line can be remarkably scaled down. Still further, according to the present preferred embodiment as described above, the structure of the grounded coplanar line is simple; and further, the grounded coplanar can be manufactured only by one-side machining or processing, this leading to simplification of its manufacturing process. Accordingly, the manufacturing cost can be remarkably reduced.

In the seventh preferred embodiment as described above, the silicon substrate 101 and the silicon substrate 102 are bonded to each other. However, the present invention is not limited to this, and the grounded coplanar line may be also implemented and embodied by a structure comprised of only the silicon substrate 101 shown in FIG. 31D.

Modified Preferred Embodiment of Seventh Preferred Embodiment

Figure 34A:
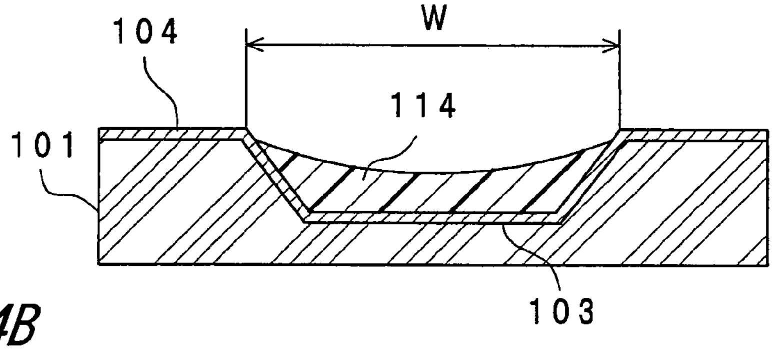
FIG. 34A is a longitudinal sectional view for explaining a problem which is caused in a partial process from FIG. 30E to FIG. 31D, showing a first step of the partial process.
Figure 34B:
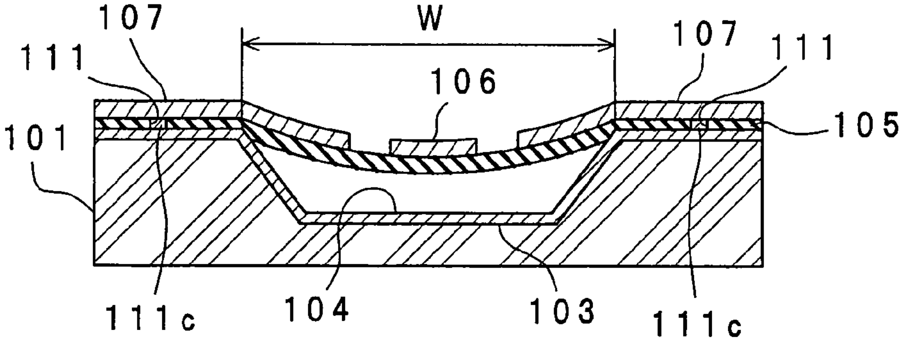
FIG. 34B is a longitudinal sectional view showing a second step of the partial process.

FIGS. 34A and 34B are longitudinal sectional views for explaining a problem caused in the partial process from FIG. 30E to FIG. 31D, showing the steps of the partial process thereof. FIGS. 35A to 35F are longitudinal sectional views for solving a problem caused in a partial process of FIGS. 34A and 34B, showing the steps of the partial process.

In this modified preferred embodiment of the seventh preferred embodiment, a manufacturing method further improved over the manufacturing method of the seventh preferred embodiment will be described below with reference to FIGS. 34A, 34B and 35A to 35F. FIGS. 34A and 34B show the problem caused in the step of planarizing the resist sacrificial layer 114 as shown in FIG. 30E. It is noted that the width of the recessed portion 103 in the surface of the silicon substrate 101 is denoted in FIG. 34 by W.

In the step shown in FIG. 30E as described above, the width of the recessed portion 103 may often become wider than a predetermined threshold width (this threshold width is, for example, 50 μm, or it is determined within a range of 10 μm to 2 mm depending on the operating wavelength or the size of the apparatus or device to be manufactured). In the step shown in FIG. 30E, the resist sacrificial layer 114 filled into the recessed portion 103 is planarized by using the CMP process so that the top surface of the resist sacrificial layer 114 becomes substantially the same horizontal surface as that of the grounding conductor films 107. In the CMP process, under such a condition that a hard material and a soft material are exposed on substantially the same horizontal surface, there may be caused such a phenomenon that polishing of the soft material progresses faster so that the surface of the soft material is formed into a recessed shape, namely, a so-called "dishing". The larger the exposure area of the soft material is relative to the exposure area of the hard material, the more noticeably the dishing appears. Accordingly, when the width W of the recessed portion 103 is beyond the threshold width that is determined as, for example, 50 μm or within a range of 10 μm to 2 mm, the resist sacrificial layer 114 would be formed into a recessed shape as shown in FIG. 34A since the resist of the resist sacrificial layer 114 is softer than Au of the grounding conductor film 104 provided around the resist thereof. As a result of this, the interconnecting conductor film 106 for transmission use and the grounding conductor films 107 would be formed under such an effect as the recessed shape of the resist sacrificial layer 114 as shown in FIG. 34B. Due to this, there has been such a problem that the characteristic impedance of the present coplanar line would change from a design value to a large extent, this leading to a cause of the insertion loss.

A manufacturing method for solving this problem will be described in detail below with reference to FIGS. 35A to 35F, which are views showing a partial process of the manufacturing process for manufacturing the present grounded coplanar line. It is noted that this manufacturing method shows a dishing reduction method other than the dishing reduction method described in the first preferred embodiment.

Figure 35A:
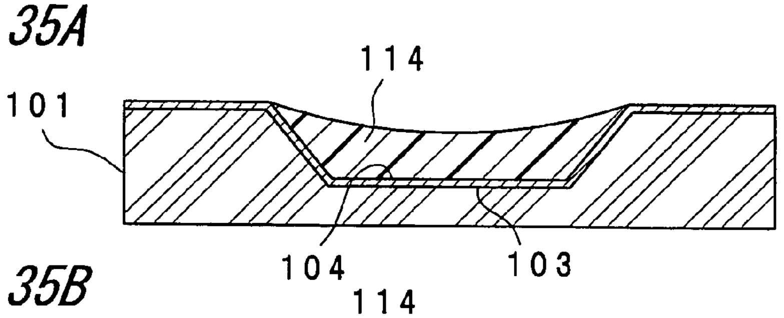
FIG. 35A is a longitudinal sectional view for solving the problem caused in the partial process of FIGS. 34A and 34B, showing a first step of the partial process.
Figure 35B:
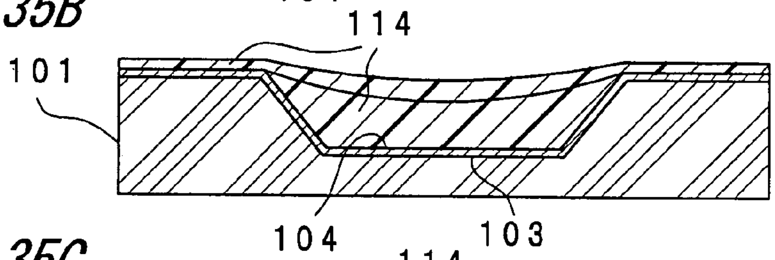
FIG. 35B is a longitudinal sectional view showing a second step of the partial process.
Figure 35C:
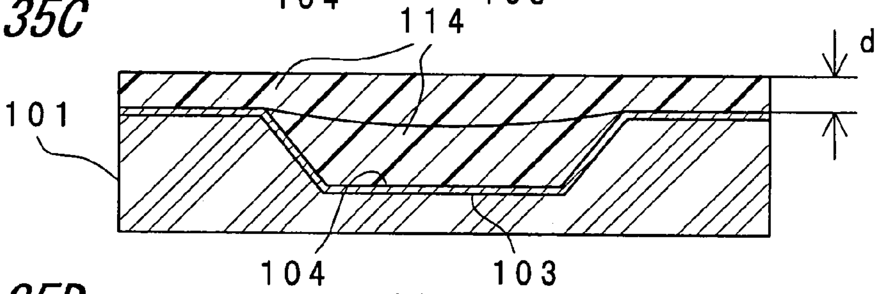
FIG. 35C is a longitudinal sectional view showing a third step of the partial process.
Figure 35D:
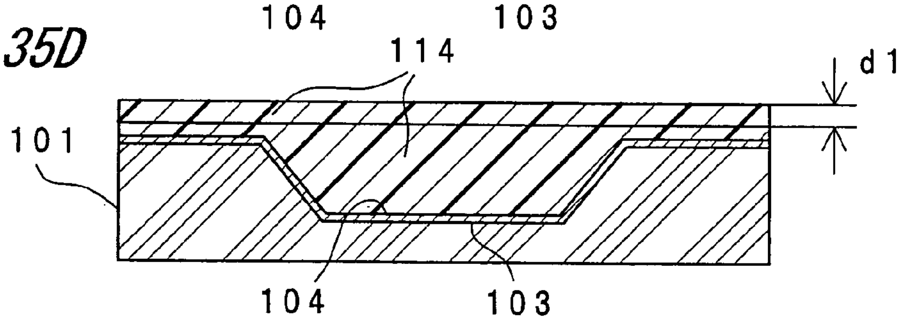
FIG. 35D is a longitudinal sectional view showing a fourth step of the partial process.
Figure 35E:
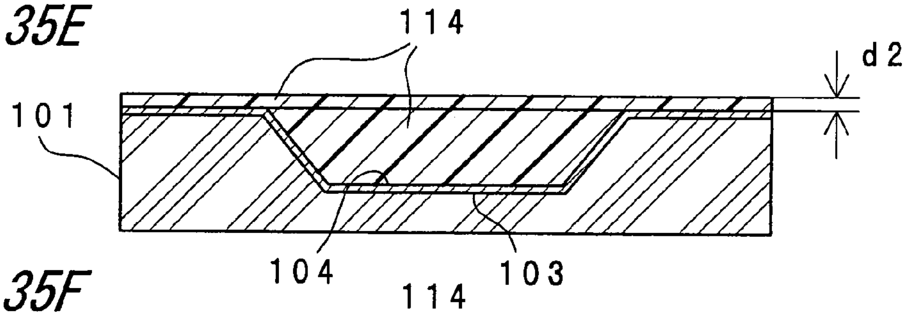
FIG. 35E is a longitudinal sectional view showing a fifth step of the partial process.

FIG. 35A shows a silicon substrate 101 that is completely subjected up to the step shown in FIG. 30E. As shown in FIG. 35A, there has occurred a dishing to the surface of the resist sacrificial layer 114 filled in the recessed portion 103. Then, as shown in FIG. 35B, the resist for the resist sacrificial layer 114 is coated onto the whole surface of the silicon substrate 101. Next, as shown in FIG. 35C, the coating is executed a plurality of times until the resist sacrificial layer 114 is planarized. It is noted that the thickness in the thickness direction from the grounding conductor film 104 to the surface of the planarized resist sacrificial layer 114 is assumed to set to a value of "d". Then, as shown in FIG. 35D, the resist sacrificial layer 114 is exposed to light by a depth d1 (<d) from the surface of the resist sacrificial layer 114, and thereafter, as shown in FIG. 35E, the resist of the resist sacrificial layer 114 corresponding to the exposed depth d1 is etched and removed by using a developer. The etching of the resist of the resist sacrificial layer 114 with the developer progresses faster in the exposed regions, and does slower in the unexposed regions. This makes it possible to allow the resist corresponding to a depth d2 (=d−d1) to be left in the unexposed regions.

Figure 35F:
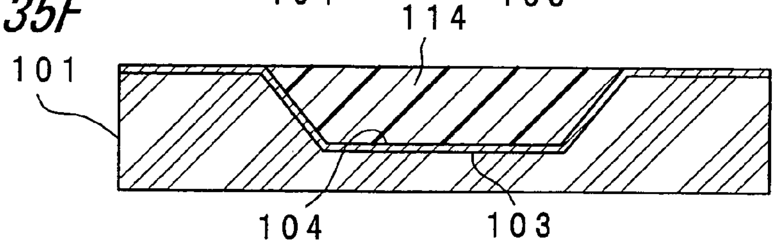
FIG. 35F is a longitudinal sectional view showing a sixth step of the partial process.

Next, as shown in FIG. 35F, in a manner similar to that of the processing step shown in FIG. 35E, the resist of the resist sacrificial layer 114 corresponding to the depth d2 is etched and removed with the developer. Since the etching rate in this region is very slow as described above, it is possible to control the processing time so that the surface of the grounding conductor film 104 and the surface of the resist sacrificial layer 114 become substantially the same horizontal surface as each other. Now that the etching of the resist sacrificial layer 114 progresses with in-plane uniformity by the effect of the immersion in the developer, such phenomena as dishing can be prevent from being caused with the surface planarity maintained. As a result, the yield upon manufacturing the present grounded coplanar line or the other high frequency lines can be remarkably improved.

The Other Modified Preferred Embodiments

The above-mentioned preferred embodiments have been described on examples of inductor devices, capacitor devices, hybrid circuits, low-pass filter circuits and transmission lines. However, the present invention is not limited to this, and the present invention can be widely applied to high frequency apparatuses including various kinds of high frequency devices, high frequency circuits, high frequency transmission lines, and the like that are operable at high frequency bands of microwave, sub-millimeter wave, millimeter wave and the like.

In the above-mentioned preferred embodiments, a plurality of opening portions 8 and 112 are formed. However, the present invention is not limited to this, and it is also allowable to form at least one opening portion necessary for removing the resist sacrificial layer 32 and 114.

Advantageous Effects of Preferred Embodiments

As described in detail above, according to the preferred embodiments of the present invention, there is provided a high frequency apparatus with a substrate having a recessed portion formed in a surface of the substrate. A first interconnecting conductor is formed on the substrate including at least the recessed portion of the substrate, and a dielectric support film is formed on the substrate above the recessed portion of the substrate with an air space sandwiched between the dielectric support film and the substrate. A second interconnecting conductor is formed on a part of a surface of the dielectric support film. Accordingly, there can be provided a high frequency apparatus, as well as a manufacturing method therefor, where the high frequency apparatus has a simple structure, and can be made by the simple manufacturing process, and further, is capable of further reducing the transmission loss, as compared with that of the prior art.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of manufacturing signal processing apparatus, including;

etching a surface of a substrate to a predetermined depth, forming a recessed portion in the surface of said substrate;

forming one of a first interconnecting conductor and a second interconnecting conductor on said substrate including at least the recessed portion of said substrate;

filling the recessed portion of said substrate with a sacrificial layer material, and removing the sacrificial layer material on said substrate, excluding at least the recessed portion of said substrate and an area proximate the recessed portion of said substrate;

planarizing said a sacrificial layer material so that said sacrificial layer material and one of (i) the surface of said substrate and (ii) said first interconnecting conductor become substantially co-planar with each other as a planarized surface;

forming a dielectric support film on at least said planarized surface of said sacrificial layer and said substrate;

forming said second interconnecting conductor on said dielectric support film;

forming at least one opening opposite said sacrificial layer and passing through said dielectric support film; and removing said sacrificial layer via said opening.

2. The method of manufacturing an apparatus according to claim 1, further including, after forming said dielectric support film and before forming said second interconnecting conductor, forming a first through hole passing through said dielectric support film at said first interconnecting conductor and said second interconnecting conductor, wherein forming said second interconnecting conductor includes filling said first through hole with said second interconnecting conductor to form a first through hole conductor that connects said first interconnecting conductor to said second interconnecting conductor.

3. The method of manufacturing an apparatus according to claim 1, further including, after forming said sacrificial layer and before forming said second interconnecting conductor, forming a third interconnecting conductor on at least said planarized surface of said sacrificial layer, wherein forming said second interconnecting conductor includes forming said dielectric support film on at least a surface of said third interconnecting conductor and said planarized surface of said sacrificial layer and on said substrate.

4. The method of manufacturing an apparatus according to claim 3, further including, after forming said dielectric support film and before forming said second interconnecting conductor, forming a through hole passing through said dielectric support film at said second interconnecting conductor and said third interconnecting conductor, wherein forming said second interconnecting conductor includes filling said second through hole with said second interconnecting conductor, so that said second through hole conductor connects said second interconnecting conductor to said fourth interconnecting conductor.

* * * * *